US008759921B2

(12) United States Patent
Seo et al.

(10) Patent No.: US 8,759,921 B2
(45) Date of Patent: Jun. 24, 2014

(54) SEMICONDUCTOR MEMORY DEVICE AND METHOD OF MANUFACTURING THE SAME

(75) Inventors: Soon Ok Seo, Gwangju (KR); Sang Bum Lee, Incheon (KR); Se Jun Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 24 days.

(21) Appl. No.: 13/455,504

(22) Filed: Apr. 25, 2012

(65) Prior Publication Data

US 2012/0273965 A1 Nov. 1, 2012

(30) Foreign Application Priority Data

Apr. 26, 2011 (KR) .................. 10-2011-0038998

(51) Int. Cl.
H01L 21/70 (2006.01)
(52) U.S. Cl.
USPC .................................. 257/382; 257/390
(58) Field of Classification Search
USPC .............................................. 257/382, 390
See application file for complete search history.

(56) References Cited

U.S. PATENT DOCUMENTS

| 8,374,033 | B2 * | 2/2013 | Kito et al. | ................ 365/185.18 |
| 2012/0206979 | A1 * | 8/2012 | Shin et al. | ................ 365/185.26 |
| 2013/0109157 | A1 * | 5/2013 | Kito et al. | .................... 438/478 |
| 2013/0121081 | A1 * | 5/2013 | Kito et al. | ................ 365/185.18 |

FOREIGN PATENT DOCUMENTS

| JP | 2010272638 | 12/2010 |
| KR | 1020000027544 | 5/2000 |
| KR | 1020020048266 | 6/2002 |
| KR | 1020080024971 | 3/2008 |

OTHER PUBLICATIONS

Notice of Allowance issued by the Korean Intellectual Property Office on Feb. 26, 2013.
Office Action issued from the Korean Intellectual Property Office on Sep. 11, 2012.

* cited by examiner

*Primary Examiner* — Ngan Ngo
(74) *Attorney, Agent, or Firm* — IP & T Group LLP

(57) ABSTRACT

A semiconductor memory device includes a plurality of memory blocks formed over a substrate including source regions and separated from each other by a slit, a plurality of bit lines coupled to the strings of the memory blocks and disposed over the memory blocks, and source contact lines formed within the slits, coupled to the source regions, respectively, and disposed in a direction to cross the plurality of bit lines.

13 Claims, 19 Drawing Sheets

SEMICONDUCTOR MEMORY DEVICE AND METHOD OF MANUFACTURING THE SAME

CROSS-REFERENCE TO RELATED APPLICATION

Priority to Korean patent application number 10-2011-0038998 filed on Apr. 26, 2011, the entire disclosure of which is incorporated by reference herein, is claimed.

BACKGROUND

Exemplary embodiments relate to a semiconductor memory device and a method of manufacturing the same and, more particularly, to a semiconductor memory device having a three dimensional (3-D) structure and a method of manufacturing the same.

When a flash memory device is operated, if a lot of current flows from a plurality of bit lines to source contact plugs coupled to a common source line, a source line bouncing phenomenon in which a voltage of the common source line is shifted by resistance of the source contact plugs occurs. The source line bouncing phenomenon deteriorates the characteristic of the flash memory device. The deterioration of the characteristic of the flash memory device due to the source line bouncing phenomenon is described in detail below.

The memory cell array of a flash memory device includes a plurality of memory strings. Each of the memory strings includes memory cells coupled in series. Furthermore, the drain of the memory string is coupled to a bit line. The plurality of memory strings coupled to the respective bit lines is in common coupled to a common source line through the source contact plugs. Furthermore, the gate of each of the memory cells forming the memory string is coupled to a word line.

In order to write data in a selected memory cell, a program operation and a verify operation are repeatedly performed within the set number of times until the selected memory cell is programmed. In the verify operation, the voltage of a bit line coupled to the selected memory cell is precharged to a high level. Next, whether the selected memory cell has been programmed is determined according to whether the voltage of the bit line has been changed by supplying a verify voltage to a word line coupled to the selected memory cell. That is, when the threshold voltage of the selected memory cell is the verify voltage or higher (that is, the selected memory cell has been programmed), the voltage of the bit line maintains a high level. If the threshold voltage of the selected memory cell has not reached the verify voltage (that is, the selected memory cell has not been programmed), the bit line is coupled to the common source line and thus the voltage of the bit line is discharged from a precharge level to a ground voltage. At this time, if the voltage of the common source line rises due to resistance of the source contact plugs coupling the common source line and the memory string coupled to the bit line, the source voltage of the selected memory cell also rises. The voltage of the common source line may be shifted depending on the program states of unselected memory cells coupled to the word line.

For example, if a verify operation is performed on the selected memory cell in the state in which all the unselected memory cells coupled to the word line have not been programmed, the voltage of the common source line may rise. Consequently, the selected memory cell may be verified to have been programmed because the voltage of the bit line is not discharged from the precharge level although the selected memory cell has not been programmed. All the unselected memory cells coupled to the word line may be programmed through a subsequent program operation. In this case, if a read operation is performed on the selected memory cell, the threshold voltage of the selected memory cell may be read as being lower than that in the verify operation because noise due to the common source line is reduced as compared with noise when the unselected memory cells are not programmed.

There occurs an under-programmed cell that is determined to have been programmed although the cell has not been programmed due to the source line bouncing phenomenon in which the voltage of the common source line is shifted according to the program states of peripheral cells as described above. The under-programmed cell increases the width of a distribution of the threshold voltages of memory cells for a specific program state. The source line bouncing phenomenon that deteriorates the characteristic of the flash memory device as described above becomes worse according to an increase in the resistance of the source contact plugs coupled to the common source line.

In a 3-D structured semiconductor memory device in which memory cells are stacked in a direction vertical to a semiconductor substrate in order to increase the degree of integration of the memory cells, a plurality of cell strings is commonly coupled to the source contact plugs with high resistance in terms of a structural characteristic. For this reason, the source line bouncing phenomenon becomes worse in the 3-D structured semiconductor memory device. Accordingly, a method of improving the source line bouncing phenomenon is useful.

BRIEF SUMMARY

Exemplary embodiments relate to a semiconductor memory device having a 3-D structure and a method of manufacturing the same, which can improve a source line bouncing phenomenon.

A semiconductor memory device according to an aspect of the present disclosure includes a plurality of memory blocks formed over a substrate including source regions and separated from each other by a slit, a plurality of bit lines coupled to the strings of the memory blocks and disposed over the memory blocks, and source contact lines formed within the slits, coupled to the source regions, respectively, and disposed in a direction to cross the plurality of bit lines.

A method of manufacturing a semiconductor memory device according to another aspect of the present disclosure includes forming a plurality of memory blocks separated from each other by a slit over a substrate including source regions, forming source contact lines arranged within the slits and coupled to the source regions, respectively, and forming a plurality of bit lines over a structure including the source contact lines.

BRIEF DESCRIPTION OF THE DRAWINGS

FIG. 5A to FIG. 11A are plan views illustrating a method of manufacturing the semiconductor memory device according to the first embodiment of this disclosure;

FIG. 5B to FIG. 11B are cross-sectional views of the semiconductor memory device taken along line I-I' of FIG. 5A to FIG. 11A;

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the disclosure.

Figure 1:
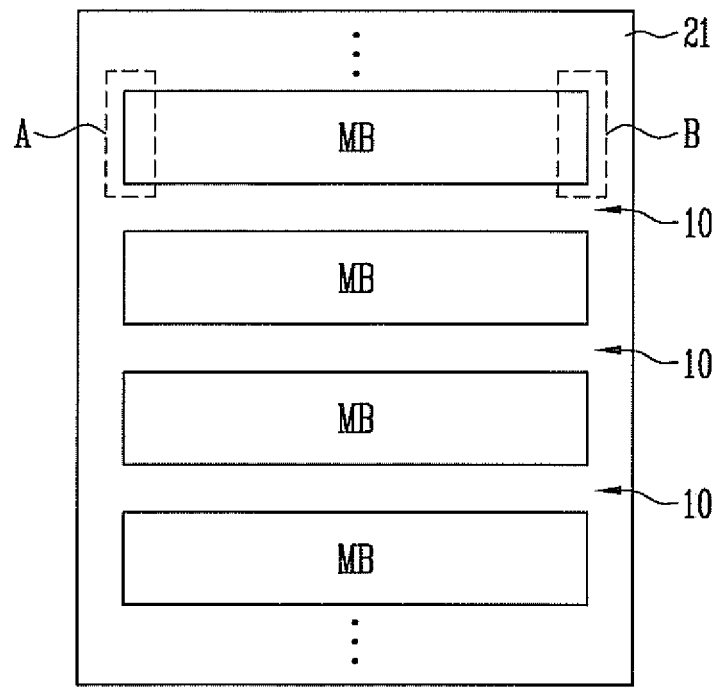
FIG. 1 is a plan view of a semiconductor memory device.

FIG. 1 is a plan view of a semiconductor memory device. Referring to FIG. 1, the memory blocks MB of the semiconductor memory device are separated from each other by slits 10. Each of both ends A and B of each of the memory blocks MB has a step structure so that a contact plug is coupled to the conductive layers of respective layers.

Figure 2A:
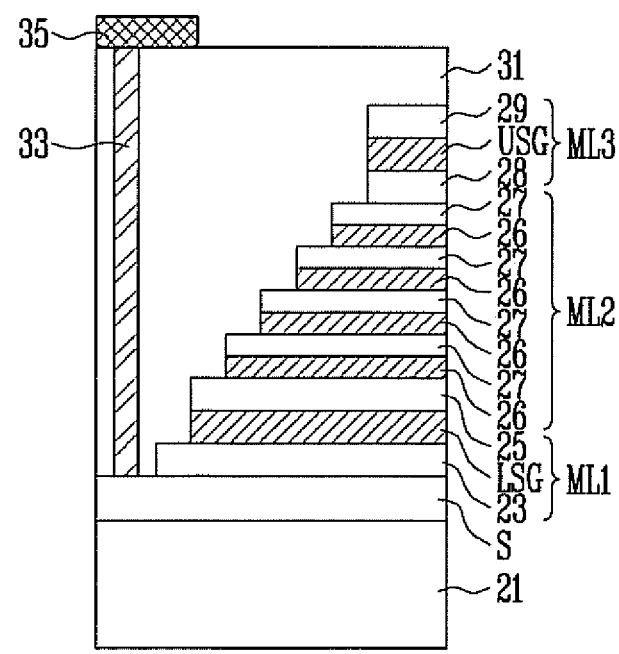
FIG. 2A is a cross-sectional view of the semiconductor memory device taken along line 'A' of FIG. 1.
Figure 2B:
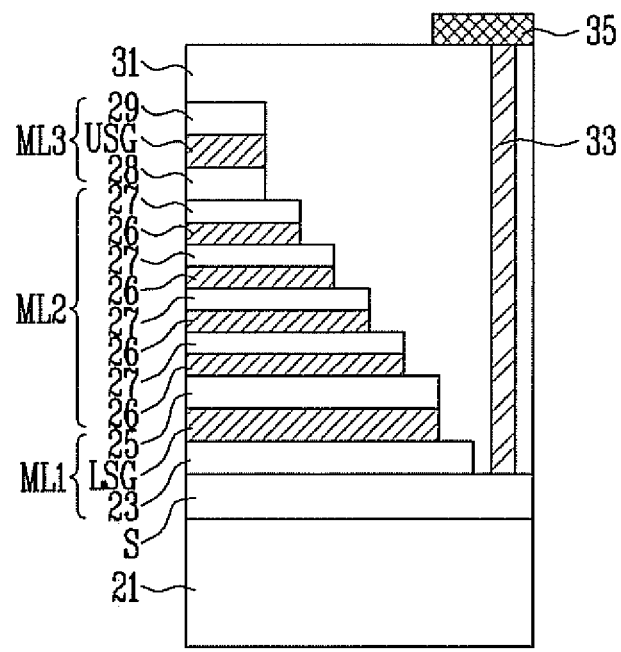
FIG. 2B is a cross-sectional view of the semiconductor memory device taken along line 'B' of FIG. 1.

FIG. 2A is a cross-sectional view of the semiconductor memory device taken along line 'A' of FIG. 1, and FIG. 2B is a cross-sectional view of the semiconductor memory device taken along line 'B' of FIG. 1.

Referring to FIGS. 2A and 2B, in order to achieve the high integration of semiconductor memory devices by stacking memory cells in a vertical direction to a semiconductor substrate 21, first to third stack structures ML1, ML2, and ML3 are formed over the semiconductor substrate 21 including a source region S. The first stack structure ML1 includes a first insulating layer 23 formed on the source region S, a lower select gate layer LSG formed on the first insulating layer 23 and formed of a conductive layer, and a second insulating layer 25 formed on the lower select gate layer LSG. The second stack structure ML2 is formed on the first stack structure ML1 and is formed by alternately stacking a plurality of cell gate layers 26 (that is, conductive layers) and a plurality of insulating layers 27. The third stack structure ML3 is formed on the second stack structure ML2. The third stack structure ML3 includes a third insulating layer 28, an upper select gate layer USG formed on the third insulating layer and formed of a conductive layer, and a fourth insulating layer 29 formed on the upper select gate layer USG.

The first to third stack structures ML1, ML2, and ML3 are classified into the plurality of memory blocks MB by the slits 10 as shown in FIG. 1. Furthermore, the both ends A and B of each of the first to third stack structures ML1, ML2, and ML3 have the step structures so that the contact plug is coupled to the conductive layers LSG, 26, and USG of the first to third stack structures ML1, ML2, and ML3. The step structure is formed by stepwise patterning the first and the second stack structures ML1 and ML2 so that both ends of the lower conductive layer LSG are more protruded than both ends of an upper conductive layer (for example, 26). A process of stepwise patterning the first and the second stack structures ML1 and ML2 is called a slimming process. The slimming process is performed by repeatedly performing an etch process while gradually reducing the width of a photoresist pattern using a photoresist pattern as an etch barrier so that a step is generated between the conductive layers LSG and 26. Although not shown, the contact plug is coupled to the conductive layers (LSG, 26, and USG) extending as the step structures and is supplied with a signal from a voltage source. The contact plug penetrates an interlayer dielectric layer 31 that covers the first to third stack structures ML1, ML2, and ML3.

Meanwhile, the source region S is exposed at both ends of the memory block MB due to the step structure. A via contact plug 33 is coupled to the source region S, so that a signal from a common source line 35 on the interlayer dielectric layer 31 is supplied to the source region S. The via contact plug 33 is formed in the contact hole that penetrates the interlayer dielectric layer 31. The via contact plug 33 has high resistance because an area where the via contact plug 33 is formed is narrow. Exemplary embodiments of the present disclosure relate to a semiconductor memory device having a structure coupled to the source region S with lower resistance than the via contact plug 33 and a method of manufacturing the same. Some exemplary embodiments of this disclosure are described in detail below.

Figure 3:
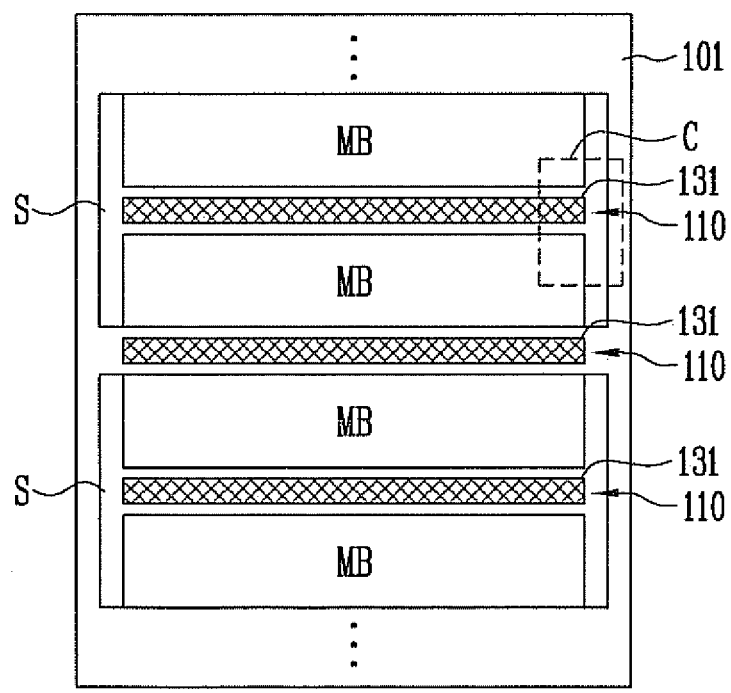
FIG. 3 is a plan view of a semiconductor memory device according to a first embodiment of this disclosure.

FIG. 3 is a plan view of a semiconductor memory device according to a first embodiment of this disclosure.

Referring to FIG. 3, the memory blocks MB of the semiconductor memory device are separated from each other by slits 110. In this disclosure, a source contact line 131 coupled to a source region S is formed within each of the slits 110. The source contact line 131 is formed in a direction vertical to the semiconductor substrate 101 in the stack direction of stack structures between the memory blocks MB. The source contact line 131 is in the form of a sheet that extends upwardly from a semiconductor substrate 101. Accordingly, the source contact line 131 according to an example has lower resistance than the source contact plug 33 of FIGS. 2A and 2B because it has a wider area than the source contact plug 33. Consequently, a source line bouncing phenomenon can be improved by the source contact line 131 formed within the slit 110 and configured to have a wider area than the source contact plug 33 of FIGS. 2A and 2B.

Figure 4:
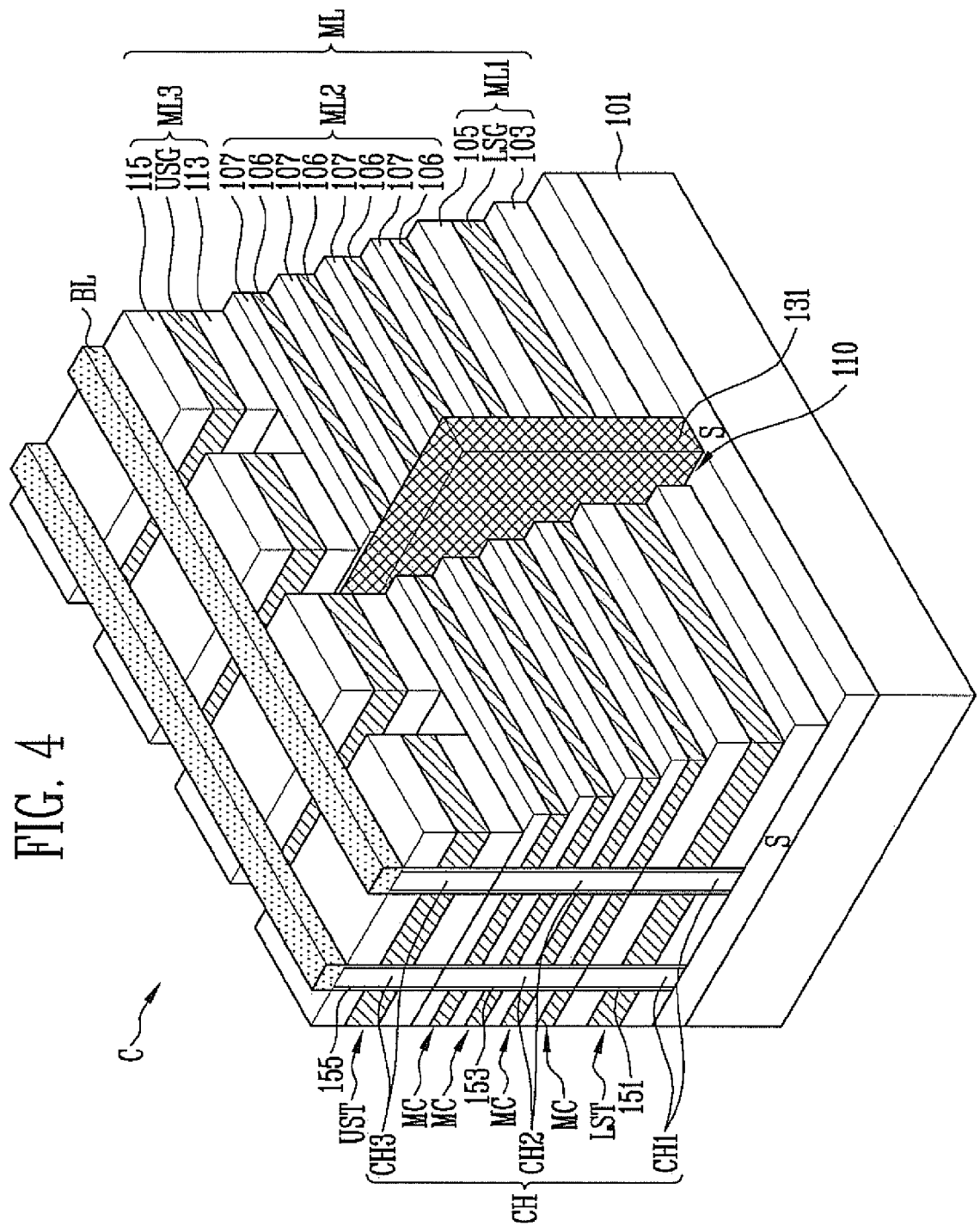
FIG. 4 is a schematic perspective view of a portion 'C' in FIG. 3.

FIG. 4 is a schematic perspective view of a portion 'C' in FIG. 3.

Referring to FIG. 4, the semiconductor memory device according to the first embodiment of this disclosure includes the memory blocks MB. Each of the memory blocks MB includes a plurality of strings arranged in a matrix form and configured to each include multi-layered memory cells MC having a 3-D structure.

Each of the strings includes a lower select transistor LST formed over the source region S, an upper select transistor UST formed over the lower select transistor LST, and the memory cells MC stacked between the lower select transistor LST and the upper select transistor UST and coupled in series. Although an example in which four memory cells MC are stacked to form one string has been illustrated, the number of memory cells MC stacked to form the string may vary.

The source region S may be formed by implanting impurities into the semiconductor substrate 101 to a specific depth or may be formed by patterning a doped polysilicon layer formed on the semiconductor substrate 101. The source region S may be assigned to the one or more memory blocks MB.

The first vertical channel layers CH1 of the lower select transistors LST are formed to penetrate a first stack structure ML1 formed on the source region S and are formed within first holes through which the source region S is exposed. The first stack structure ML1 includes a first insulating layer 103 formed on the source region S, a lower select gate layer LSG formed on the first insulating layer 103 and formed of a conductive layer, and a second insulating layer 105 formed on the lower select gate layer LSG. A first gate insulating layer 151 is formed in a pipe form on the inner wall of each of the first holes. The first vertical channel layers CH1 are surrounded by the lower select gate layers LSG with the first gate insulating layer 151 interposed therebetween.

The second vertical channel layers CH2 of the multi-layered memory cells MC are formed to penetrate a second stack structure ML2 formed on the first stack structure ML1 and are formed within second holes through which the first vertical channel layers CH1 are exposed, respectively. The second stack structure ML2 includes cell gate layers 106 and insulating layers 107 which are alternately stacked over the first stack structure ML1. Each of the cell gate layers 106 is formed of a conductive layer. A charge blocking layer, a charge trap layer 153, and a tunnel dielectric layer are formed in a pipe form on the inner wall of each of the second holes. While the charge blocking layer and the tunnel dielectric layer are not shown, the charge trap layer 153 between the charge blocking layer and the tunnel dielectric layer is shown. The second vertical channel layers CH2 are surrounded by the cell gate layers 106. The memory cells MC are formed at the respective crossings of the cell gate layers 106 and the second vertical channel layers CH2 and are surrounded by the cell gate layers 106.

The charge trap layer 153 functions as a substantial data depository and functions to store or erase data by trapping or discharging electric charges in or from a trap site. The charge blocking layer (not shown) functions to prohibit electric charges, stored in the charge trap layer 153, from moving to the cell gate layers 106. The tunnel dielectric layer (not shown) functions as a potential barrier when electric charges are injected from the second vertical channel layers CH2 to the charge trap layer 153 or when electric charges stored in the charge trap layer 153 are moved into the second vertical channel layers CH2.

The third vertical channel layers CH3 of the upper select transistors UST are formed to penetrate a third stack structure ML3 formed on the second stack structure ML2 and are formed within third holes through which the second vertical channel layers CH2 are exposed, respectively. The third stack structure ML3 includes a third insulating layer 113 formed on the second stack structure ML2, an upper select gate layer USG formed on the third insulating layer 113 and formed of a conductive layer, and a fourth insulating layer 115 formed on the upper select gate layer USG. In this structure, the third and the fourth insulating layers 113 and 115 may be omitted. A second gate insulating layer 155 is formed in a pipe form on the inner wall of each of the third holes. The third vertical channel layers CH3 are surrounded by the upper select gate layers USG with the second gate insulating layer 155 interposed therebetween.

Furthermore, a vertical channel layer CH including the first to third vertical channel layers CH1, CH2, and CH3 sequentially stacked is vertically protruded from the semiconductor substrate 101, and the third vertical channel layers CH3 are coupled to respective bit lines BL. Thus, a plurality of the bit lines BL is coupled to the strings. The plurality of bit lines BL extends in one direction. Furthermore, a stack structure ML including the first to third stack structures ML1, ML2, and ML3 sequentially stacked is divided into the plurality of memory blocks.

According to an example, the first and the second stack structures ML1 and ML2 are separated into the plurality of memory blocks MB by the slits 110. The source contact lines 131 are formed in a direction to cross the bit lines BL. Since each of the source contact lines 131 is formed within the slit 110, the source contact line 131 may have a wider area than a source contact plug formed within a contact hole. Accordingly, the source contact line 131 may be formed to have lower resistance than the source contact plug 33 of FIGS. 2A and 2B and may be coupled to the source region S. Consequently, a source line bouncing phenomenon occurring in a 3-D structured semiconductor memory device can be improved. The source contact line 131 may be formed to penetrate a block insulating layer that fills the insides of the slits 110. Furthermore, the source contact lines 131 are coupled to a common source line disposed over the bit lines BL.

Step structures are formed at both ends of each of the memory blocks MB in the same direction as the bit lines BL. A contact plug may be coupled to the conductive layers LSG, 106, and USG through the step structures.

FIG. 5A to FIG. 11A are plan views illustrating a method of manufacturing the semiconductor memory device according to the first embodiment of this disclosure. FIG. 5B to FIG. 11B are cross-sectional views of the semiconductor memory device taken along line I-I' of FIG. 5A to FIG. 11A. FIG. 12 is a cross-sectional view of the semiconductor memory device taken along line II-IF of FIG. 11A.

Figure 5A:
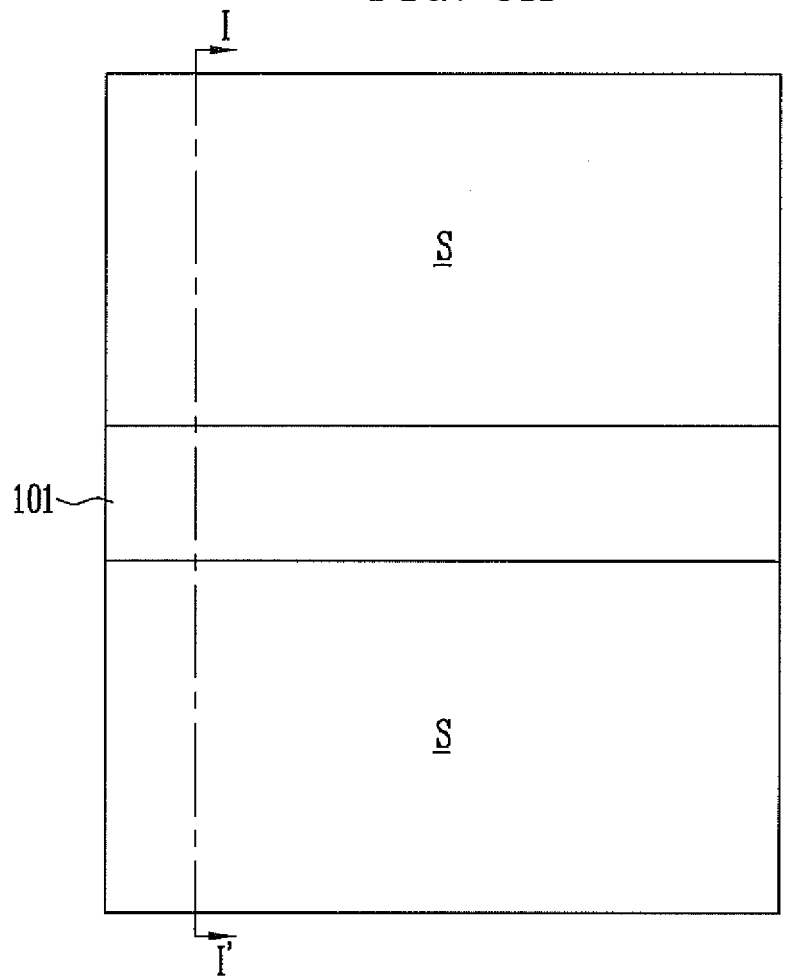
Figure 5B:
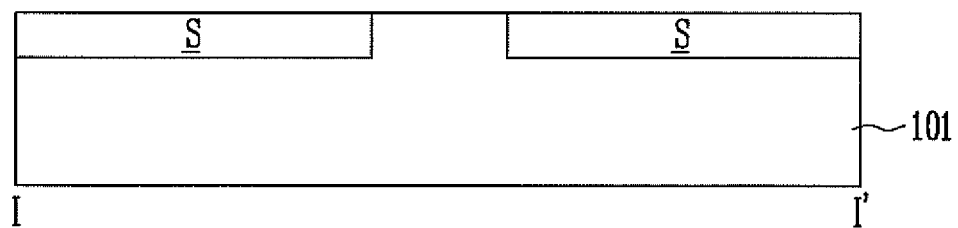

Referring to FIGS. 5A and 5B, the semiconductor substrate 101 including the source region S is formed. The source region S may be formed by implanting impurities into the semiconductor substrate 101 or may be formed by forming a doped polysilicon layer doped with impurities on the semiconductor substrate 101 and subsequently patterning the doped polysilicon layer. The source region S may form a plurality of regions, and each of the plurality of regions may be controlled in various ways according to a chip size.

Impurities for forming a well region may be implanted into the semiconductor substrate 101. If the source region S is formed by implanting the impurities, the source region S is formed within the well region.

Figure 6A:
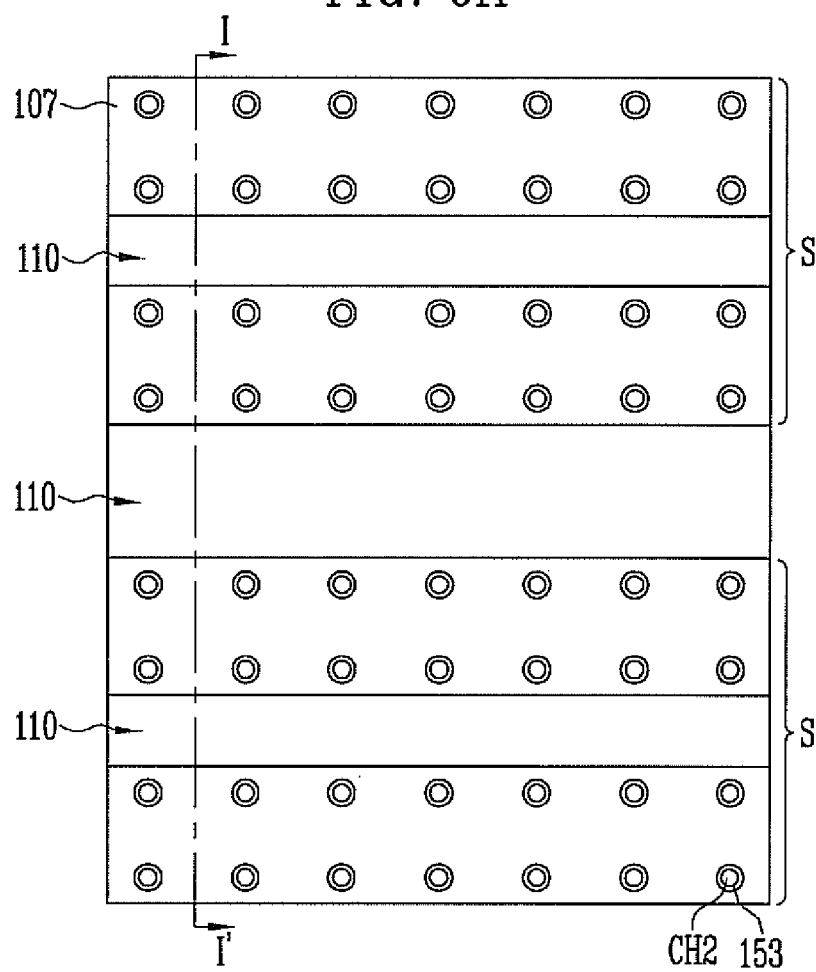
Figure 6B:
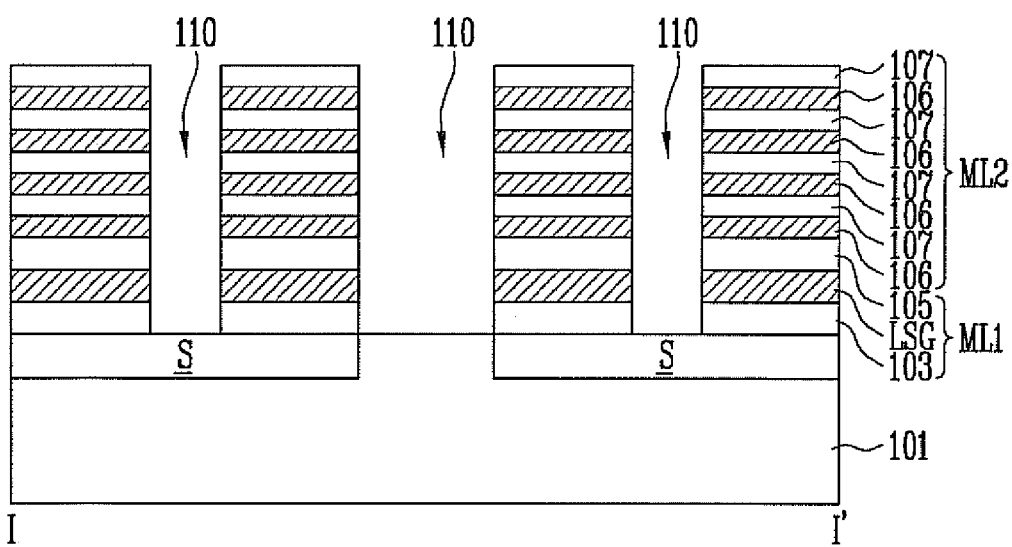

Referring to FIGS. 6A and 6B, the first insulating layer 103, the lower select gate layer LSG, and the second insulating layer 105 for the first stack structure ML1 are stacked over the semiconductor substrate 101 including the source region S. Next, the first holes through each of which the source region is exposed are formed by etching the first stack structure ML1. Next, a first gate insulating layer is formed within the first holes. The first gate insulating layer is formed not only on the inner walls of the first holes but also on top of the first stack structure ML1 and on the source regions S exposed at the bottoms of the first holes. The first gate insulating layer that is formed on top of the first stack structure ML1 and at the bottoms of the first holes is removed by an etch process, such as etch-back, so that the first gate insulating layer remains, for example, only on the inner walls of the first holes. Next, the first holes are filled with polysilicon, so that the first vertical channel layers CH1 coupled to the source region S are formed. Accordingly, the lower select transistors LST are formed.

Next, the cell gate layers 106 and the insulating layers 107 for the second stack structure ML2 are alternately stacked over the first stack structure ML1 in which the first vertical channel layers CH1 are formed. The number of cell gate layers 106 and the number of insulating layers 107 may be changed variously depending on the number of memory cells to be stacked. Each of the cell gate layers 106 may be a silicon layer, and each of the insulating layers 107 may be an oxide layer.

Next, the second holes through which the first vertical channel layers CH1 are exposed, respectively, are formed by etching the second stack structure ML2. Next, the charge blocking layer, the charge trap layer 153, and the tunnel dielectric layer are sequentially formed over all the insides of the second holes. The charge blocking layer and the tunnel dielectric layer may be formed of silicon oxide layers, and the charge trap layer 153 may be formed of a silicon nitride layer including traps for binding electric charges. That is, an Oxide/Nitride/Oxide (ONO) layer is formed within the second holes. The charge blocking layer, the charge trap layer 153, and the tunnel dielectric layer are formed not only on the inner walls of the second holes but also on top of the second stack structure ML2 and on the first vertical channels CH1 exposed at the bottoms of the second holes.

Next, the charge blocking layer, the charge trap layer 153, and the tunnel dielectric layer that are formed on top of the second stack structure ML2 and at the bottoms of the second holes are removed by an etch process, such as etch-back, so that the charge blocking layer, the charge trap layer 153, and the tunnel dielectric layer remain, for example, only on the inner walls of the second holes. Next, the second holes are filled with polysilicon, so that the second vertical channel layers CH2 coupled to the first vertical channel layers CH1, respectively, are formed. Accordingly, the multi-layered memory cells MC are formed.

In order to split the first and the second stack structures ML1 and ML2 into the plurality of memory blocks, the slits 110 are formed by etching the first and the second stack structures ML1 and ML2. The source regions S are exposed through the slits 110. In the first embodiment of this disclosure, the slits 110 are formed to extend from a surface of the source region S to the second stack structure ML2 (that is, through the multi-layered memory cells).

Figure 7A:
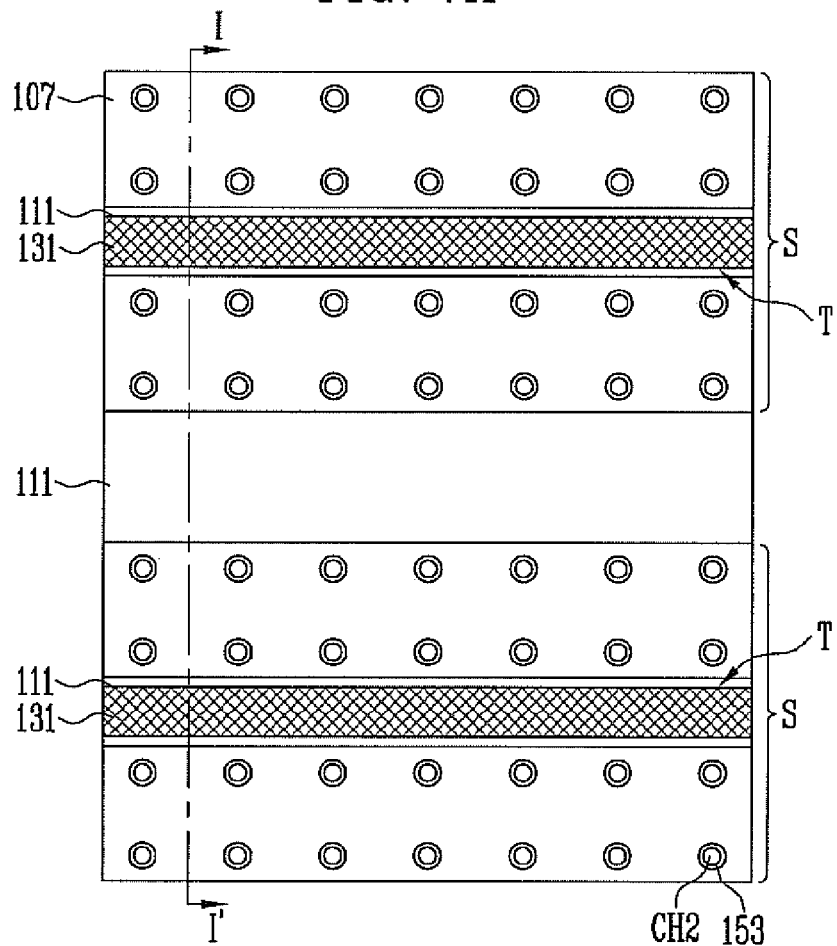
Figure 7B:
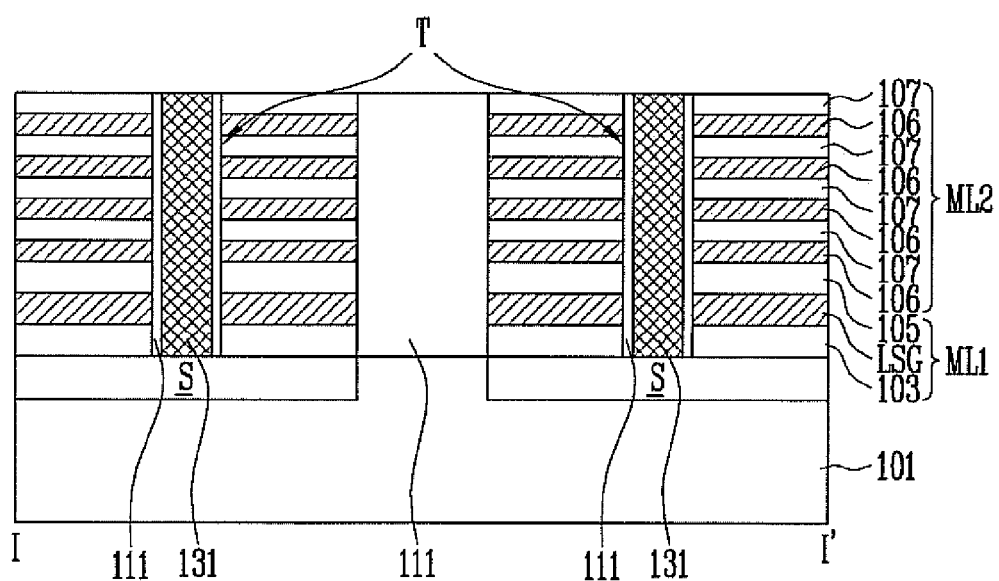

Referring to FIGS. 7A and 7B, the insides of the slits are filled with a block insulating layer 111. The block insulating layer 111 is deposited to fill the insides of the slits 110 and is subsequently polished by a polishing process, such as chemical mechanical polishing (CMP). The block insulating layer 111 may be formed of an oxide layer. Before the block insulating layer 111 is formed, a nitride layer that functions as an etch-stop layer when the block insulating layer 111 is polished may be further formed on top of the second stack structure ML2. The memory blocks MB are insulated from each other by the block insulating layer 111.

Next, trenches T are formed within the slits 110 by etching the block insulating layer 111 on top of the source regions S. The trenches T are formed to expose the source regions S.

In some embodiments, the block insulating layer 111 may be formed by depositing the block insulating layer 111 on the entire surface and subsequently removing the block insulating layer 111, formed at the bottoms of the slits 110 and on top of the second stack structure ML2, by an etch process, such as etch-back, so that the block insulating layer 111 remains, for example, only on the sidewalk of the slits 110. Accordingly, the trench T is defined between the block insulating layers 111 within each of the slits 110.

A conductive layer is formed to fill the trenches T. The conductive layer may be a polysilicon layer, a metal layer, a metal alloy layer, or a metal silicide layer. The metal layer may be made of tungsten (W) or copper (Cu), which has low resistance, and the metal silicide layer may be made of nickel silicide (NiSix) or tungsten silicide (WSix) having low resistance. Here, x is a natural number. The conductive layer is polished by chemical mechanical polishing (CMP) so that it remains, for example, only within the trenches T. Accordingly, the source contact lines 131 are formed within the respective trenches T. Each of the source contact lines 131 is coupled to the source region S and is formed to have the same height as the slit 110. The block insulating layer 111 remains between the source contact line 131 and the inner walls of the slit 110.

Although not shown, the step structures are formed at both ends of each of the first and the second stack structures ML1 and ML2 split by the memory block so that both ends of the lower conductive layer LSG extends more than both ends of the upper conductive layer 106. The step structures are formed by stepwise patterning the first and the second stack structures ML1 and ML2 by using a slimming process. The slimming process is performed by repeatedly performing an etch process so that the step structures are formed at both ends of the conductive layers LSG and 106 while reducing the width of a photoresist pattern at each etching process by using the photoresist pattern as an etch barrier.

Figure 8A:
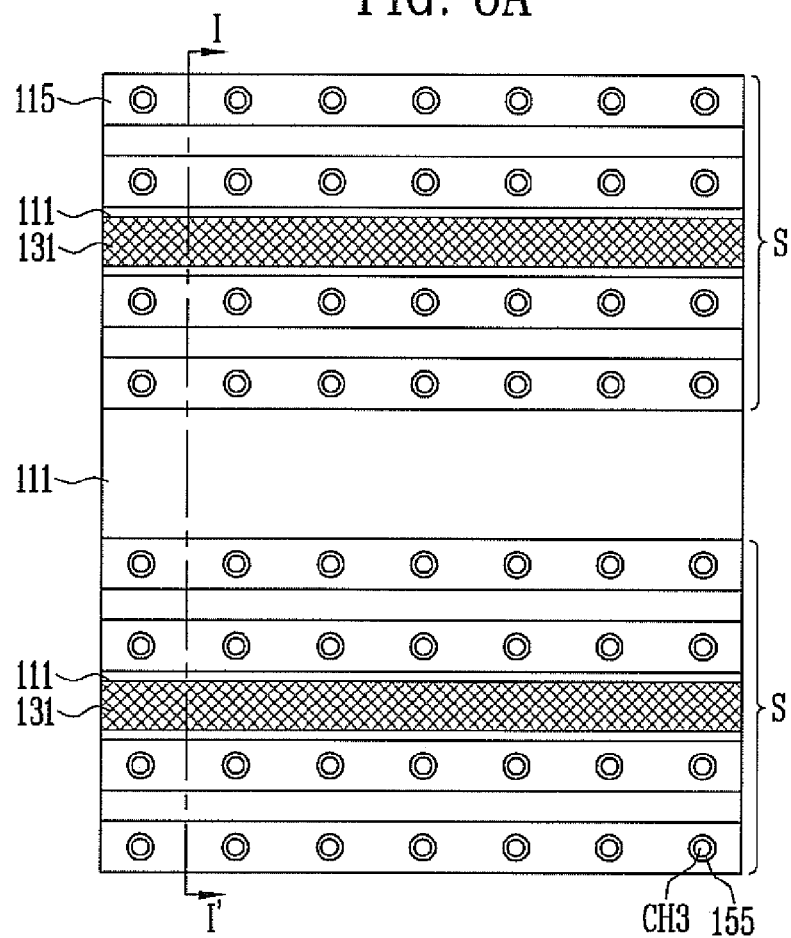
Figure 8B:
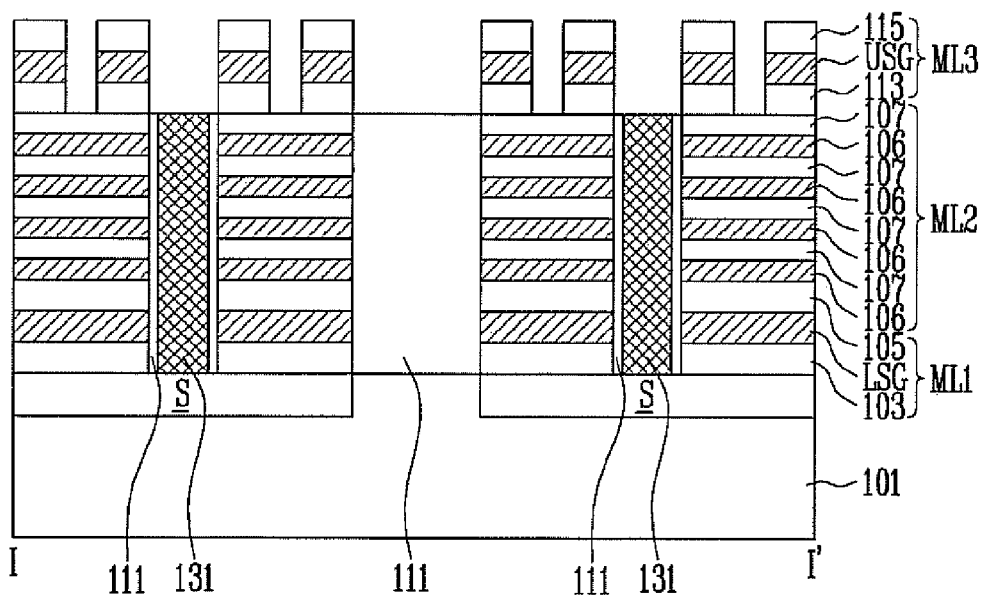

Referring to FIGS. 8A and 8B, the third stack structure ML3 is formed by stacking the third insulating layer 113, the upper select gate layer USG, and the fourth insulating layer 115 over the second stack structure ML2. Next, the third holes through which the second vertical channel layers CH2 are exposed, respectively, are formed by etching the third stack structure ML3. Next, a second gate insulating layer 155 is formed on the insides of the third holes. The second gate insulating layer 155 is formed not only on the inner walls of the third holes, but also on top of the second stack structure ML2 and on the second vertical channels CH2 exposed at the bottoms of the third holes.

The second gate insulating layer 155 formed on top of the second stack structure ML2 and at the bottoms of the third holes is removed by an etch process (for example, an etch-back process) so that the second gate insulating layer 155 remains, for example, only on the inner walls of the third holes. Next, the third vertical channel layers CH3 coupled to the second vertical channel layers CH2, respectively, are formed by filling the insides of the third holes with polysilicon. Thus, the upper select transistors UST are formed. Next, the third stack structure ML3 in which the third vertical channel layers CH3 are formed is etched, so that the third stack structure ML3 is split into the plurality of memory blocks MB or into units each smaller than the memory block.

Figure 9A:
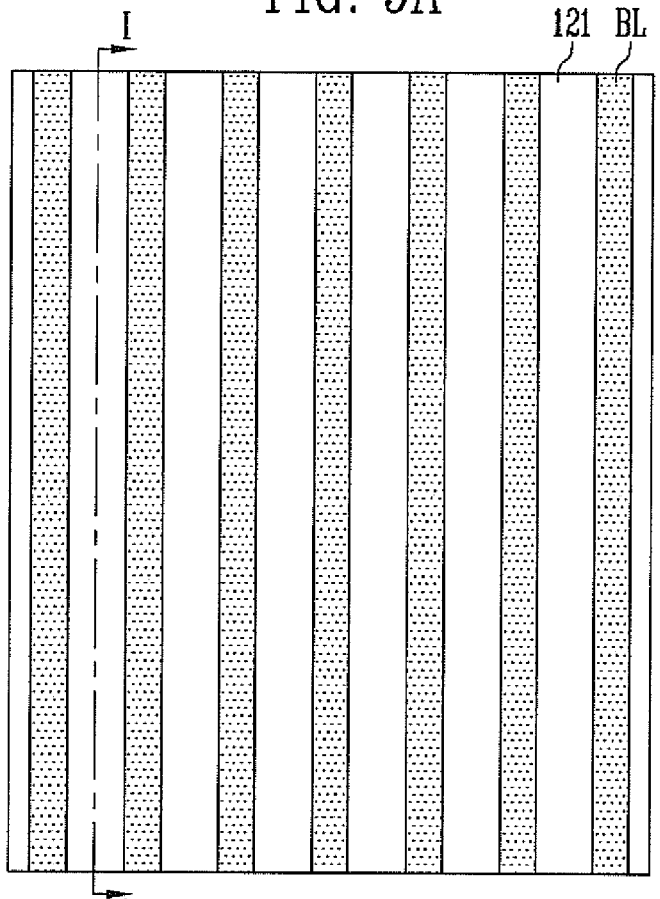
Figure 9B:
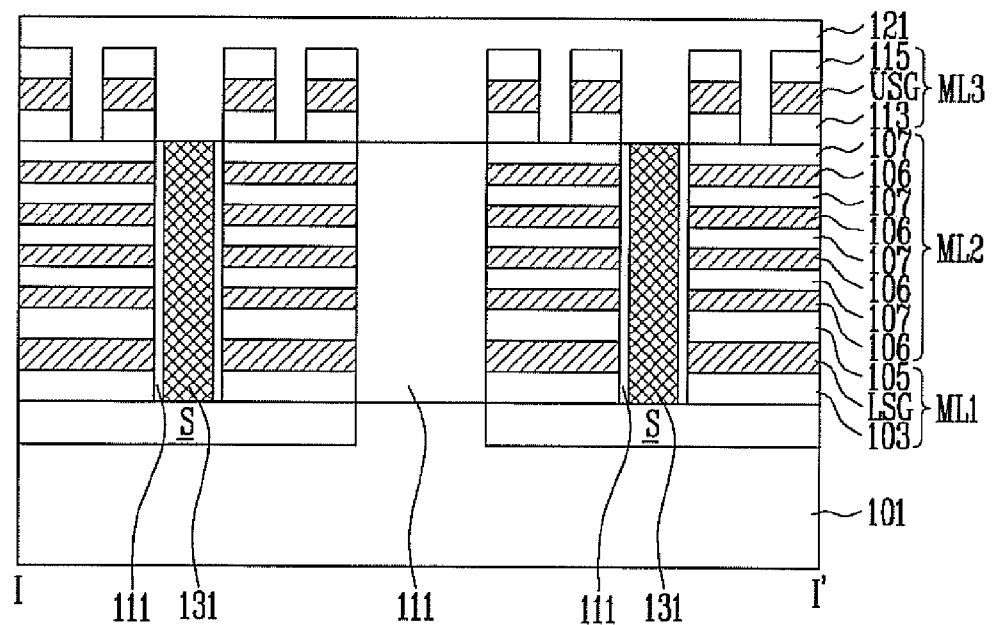

Referring to FIGS. 9A and 9B, a first interlayer dielectric layer 121 is formed on the entire surface in which the third vertical channel layers CH3 are formed. Trenches through which the third vertical channel layers CH3 are exposed are formed by etching the first interlayer dielectric layer 121. After conductive material, such as metal, is formed on the entire surface in order to fill the trenches, the plurality of bit lines BL spaced apart from each other is formed by performing chemical mechanical polishing (CMP) or a patterning process. The bit lines BL are formed within the respective trenches and are coupled to the third vertical channel layers CH3. Furthermore, the bit lines BL are formed in a direction to cross the source contact lines 131.

Figure 10A:
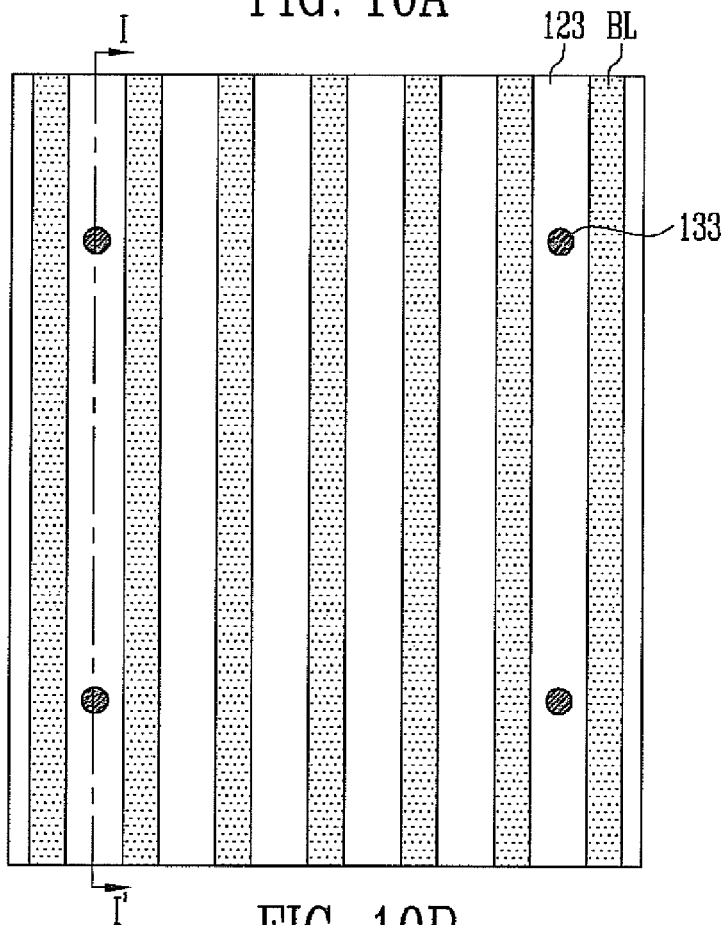
Figure 10B:
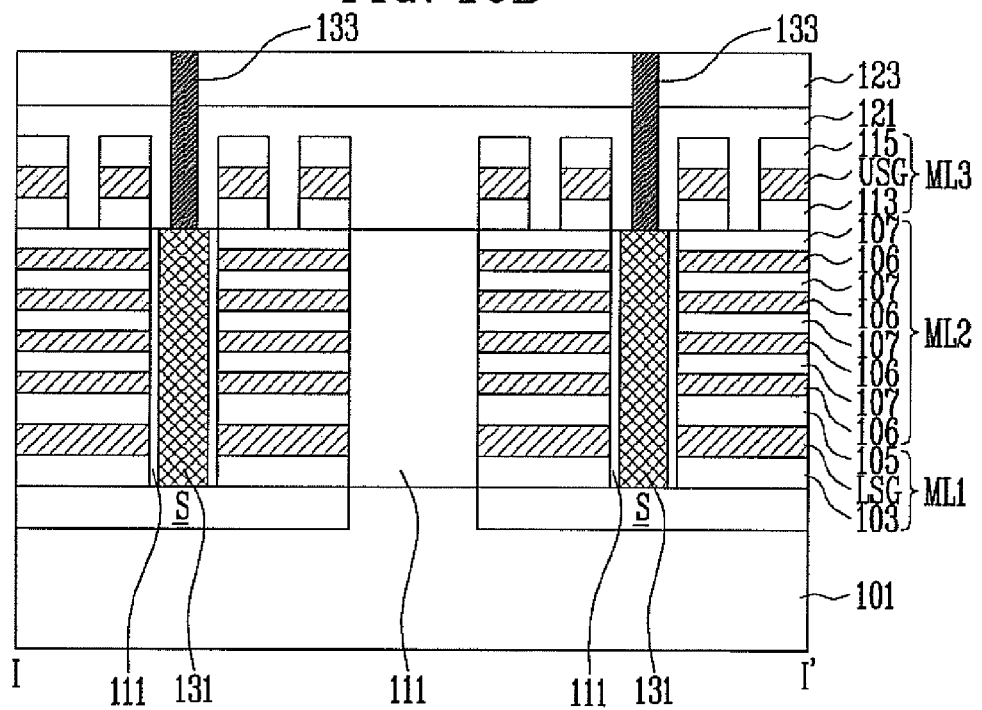

Referring to FIGS. 10A and 10B, a second interlayer dielectric layer 123 is formed on the entire surface in which the bit lines BL are formed. The second interlayer dielectric layer 123 and the first interlayer dielectric layer 121 are etched to form via holes. The via holes are formed to penetrate the second interlayer dielectric layer 123 and the first interlayer dielectric layer 121 so that parts of the source contact lines 131 are exposed. After the via holes are filled with conductive material by deposition, the conductive material is polished by a polishing process, such as chemical mechanical polishing (CMP), so that via contact plugs 133 are formed within the respective via holes. The via contact plugs 133 are formed to penetrate the second interlayer dielectric layer 123 and the first interlayer dielectric layer 121 and are coupled to the respective source contact lines 131. The via holes and the via contact plugs 133 are coupled to the respective source contact lines 131. The conductive material forming the via contact plugs 133 may be a metal layer, a metal alloy layer, or a silicide layer.

Figure 11A:
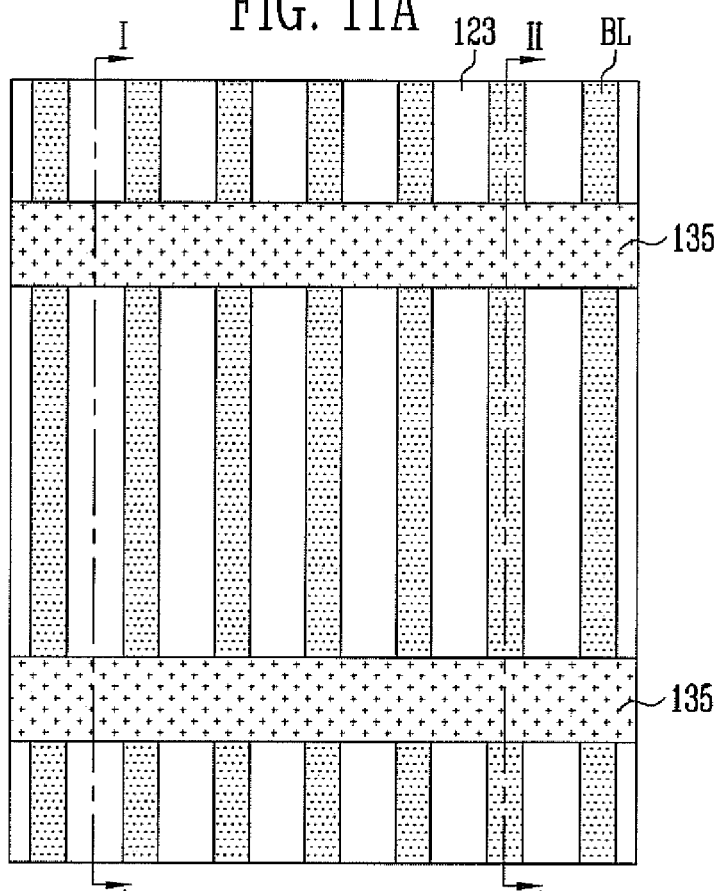
Figure 11B:
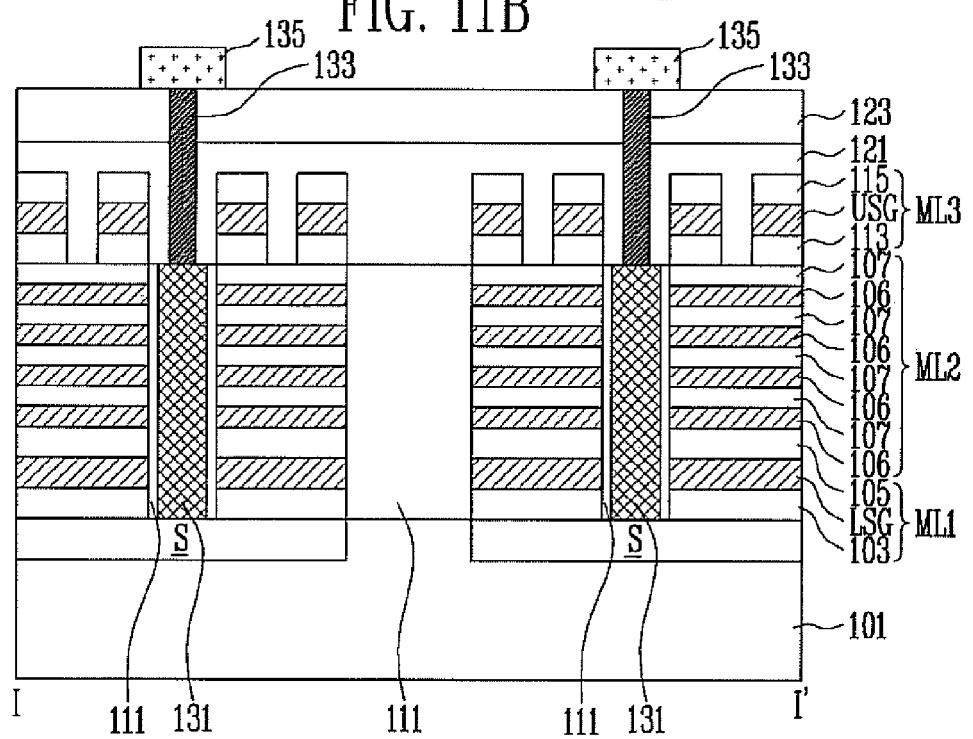
Figure 12:
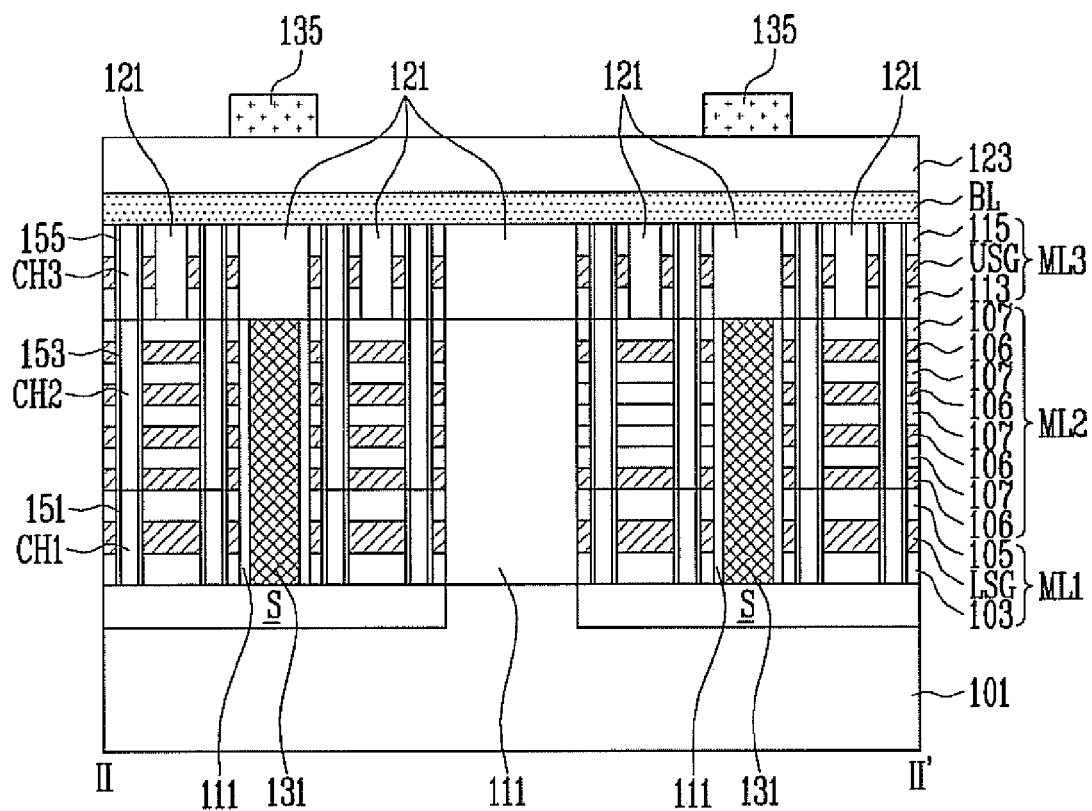
FIG. 12 is a cross-sectional view of the semiconductor memory device taken along line II-II' of FIG. 11A.

Referring to FIGS. 11A and 11B, common source lines 135 are further formed on the entire surface in which the via contact plugs 133 are formed. The common source lines 135 are formed in parallel to the source contact lines 131 and are coupled to the respective via contact plugs 133. An electrical signal is supplied to the source contact lines 131 through the common source lines 135.

A cross section of the semiconductor memory device taken along the direction of the bit lines BL is shown in FIG. 12.

Although not shown, the conductive layers protruding at both ends of each of the memory blocks having the step structures are coupled to the contact plugs through at least one interlayer dielectric layer.

As described above, in the first embodiment of this disclosure, the source contact line 131 coupled to the source region S can be formed as a sheet extending in a direction vertical to the semiconductor substrate 101 so that it has a wide area. Accordingly, a source line bouncing phenomenon can be reduced because resistance of the source contact line 131 coupled to the source region S is reduced.

Figure 13:
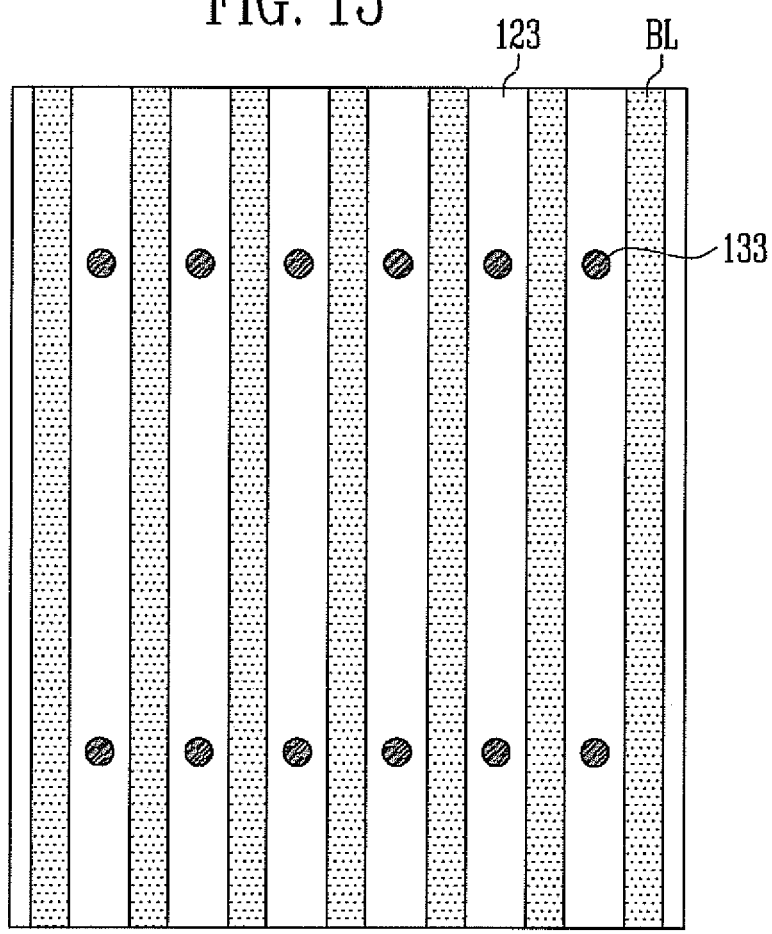
FIG. 13 is a plan view of a semiconductor memory device according to a second embodiment of this disclosure.

FIG. 13 is a plan view of a semiconductor memory device according to a second embodiment of this disclosure. As shown in FIG. 13, the via hole and the via contact plug 133 shown in FIGS. 10A and 10B may be formed between the plurality of bit lines BL so that a plurality of the via holes and the via contact plugs is coupled to each of the source contact lines.

FIGS. 14A to 14E are perspective views illustrating a semiconductor memory device and a method of manufacturing the same according to a third embodiment of this disclosure.

Figure 14A:
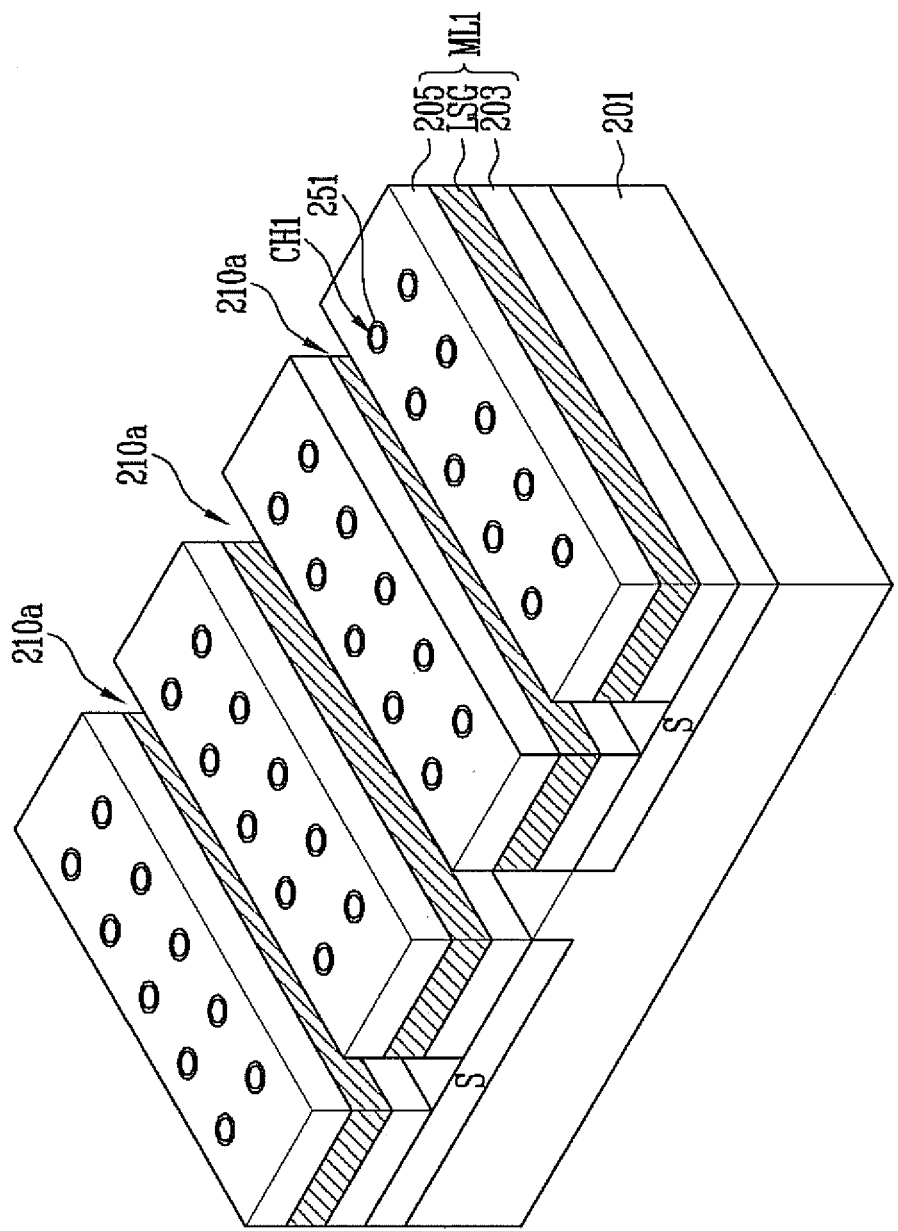
FIGS. 14A to 14E are perspective views illustrating a semiconductor memory device and a method of manufacturing the same according to a third embodiment of this disclosure.

Referring to FIG. 14A, a semiconductor substrate 201 including source regions S is formed. The source regions S may be formed by implanting impurities into the semiconductor substrate 201 or may be formed by forming a doped polysilicon layer doped with impurities on the semiconductor substrate 201 and subsequently patterning the doped polysilicon layer. The source regions S may be spaced apart from each other. In this case, the size of the area of the source region S may vary according to a chip size.

Impurities for forming a well region may be implanted into the semiconductor substrate 201. If the source regions S are formed by implanting the impurities, the source regions S are formed within the well region.

A first insulating layer 203, a lower select gate layer LSG, and a second insulating layer 205 for a first stack structure ML1 are stacked over the semiconductor substrate 201 including the source regions S. Next, first holes through which the respective source regions are exposed are formed by etching the first stack structure ML1. Next, a first gate insulating layer 251 is formed within the first holes. Here, the first gate insulating layer 251 is formed not only on the inner walls of the first holes, but also on top of the first stack structure ML1 and on the source regions S exposed at the bottoms of the first holes. The first gate insulating layer 251 that is formed on top of the first stack structure ML1 and at the bottoms of the first holes is removed by an etch process, such as etch-back, so that the first gate insulating layer 251 remains, for example, only on the inner walls of the first holes. Next, the first holes are filled with polysilicon, so that first vertical channel layers CH1 coupled to the source regions S are formed. Accordingly, lower select transistors are formed.

In order to split the first stack structure ML1 into the plurality of memory blocks, first slits 210a are formed by etching the first stack structure ML1. The source regions S are exposed through the first slits 210a. The first slits 210a are formed to extend from a surface of the source regions S to the first stack structure ML1 in which the lower select transistors are formed.

Figure 14B:
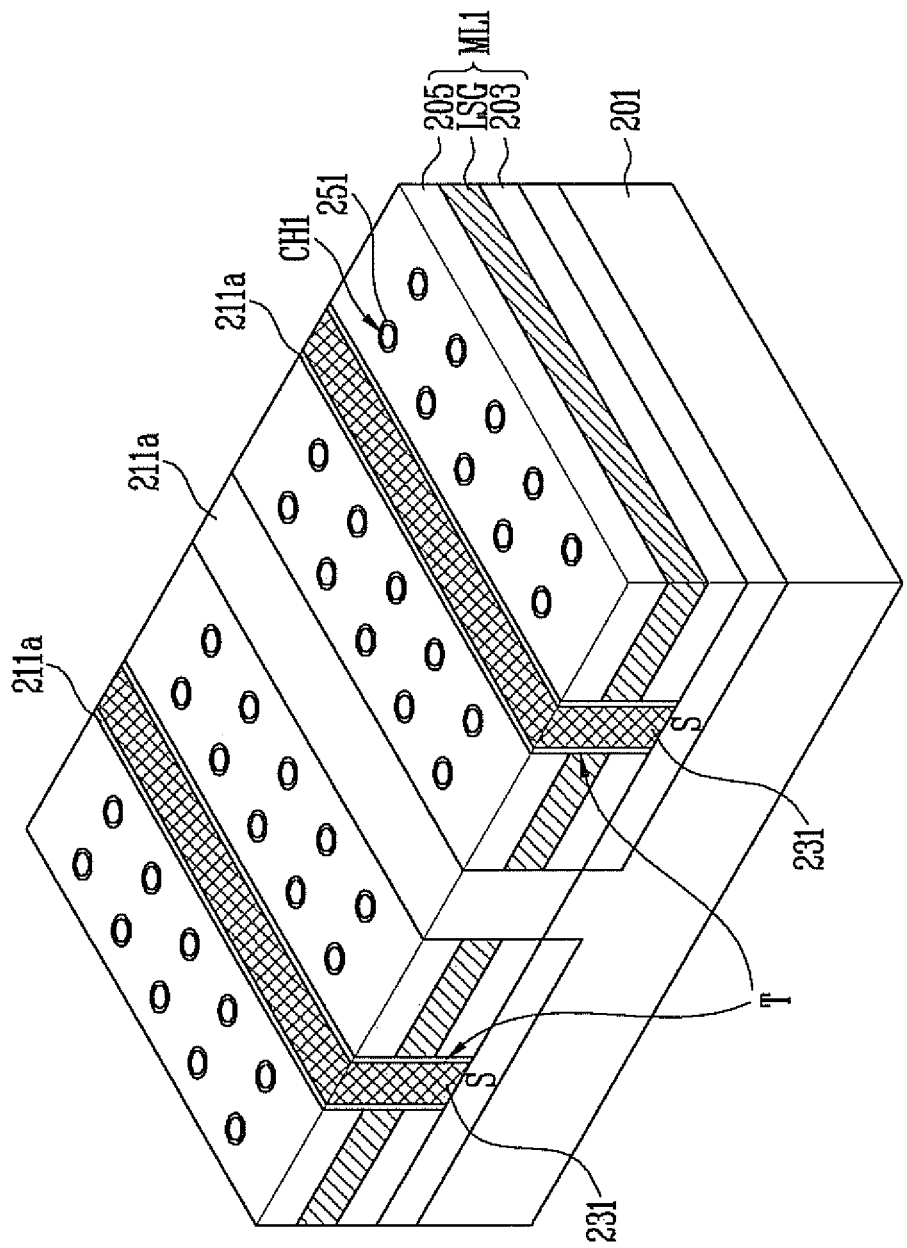

Referring to FIG. 14B, the insides of the first slits 210a are filled with a first block insulating layer 211a. The first block insulating layer 211a is deposited to fill the insides of the first slits 210a on the entire surface and is subsequently polished by a polishing process, such as chemical mechanical polishing (CMP). The first block insulating layer 211a may be formed of an oxide layer. The first stack structures ML1 split by the memory block are insulated from each other by the first block insulating layer 211a.

Trenches T through which the source regions S are exposed through the first block insulating layer 211a are formed within the first slits 210a by etching the first block insulating layer 211a on top of the source regions S.

In some embodiments, the first block insulating layer 211a may be formed by depositing the first block insulating layer 211a on the entire surface and subsequently removing the first block insulating layer 211a, formed at the bottoms of the first slits 210a and on top of the second stack structures ML2, by an etch process, such as etch-back, so that the first block insulating layer 211a remains, for example, only on the sidewalls of the first slits 210a. Accordingly, the trench T is defined within the first slit 210a between the block insulating layers 211a.

A conductive layer is formed to fill the trenches T. The conductive layer may be a polysilicon layer, a metal layer, a metal alloy layer, or a metal silicide layer. The metal layer may be made of tungsten (W) or copper (Cu), which has low resistance, and the metal silicide layer may be made of nickel silicide (NiSix) or tungsten silicide (WSix) having low resistance. Here, x is a natural number. The conductive layer is polished by chemical mechanical polishing (CMP) so that it remains, for example, only within the trenches T. Accordingly, source contact lines 231 are formed within the respective trenches T. The source contact lines 231 are coupled to the respective source region S and are formed to have the same height as the first slits 210a. The first block insulating layer 211a remains between the source contact line 231 and the inner walls of the first slit 210a.

As described above, in the second embodiment of this disclosure, as in the first embodiment, the source contact lines 231 are formed within the first slits 210a. Accordingly, the source contact line 231 can have a wider area than the contact plug formed within the contact hole. Consequently, in the second embodiment of this disclosure, a source line bouncing phenomenon can be reduced because resistance of the source contact lines 231 is lowered.

In the second embodiment of this disclosure, before a second stack structure is formed, the trenches T are formed by etching the first block insulating layer 211a within the first slits 210a, so that the aspect ratio of the trench T can be improved. Accordingly, a phenomenon in which voids are formed within the source contact lines 231 can be improved because the source contact lines 231 are formed by filling the trench T, having a smaller aspect ratio than that of the first embodiment, with the conductive layer.

Figure 14C:
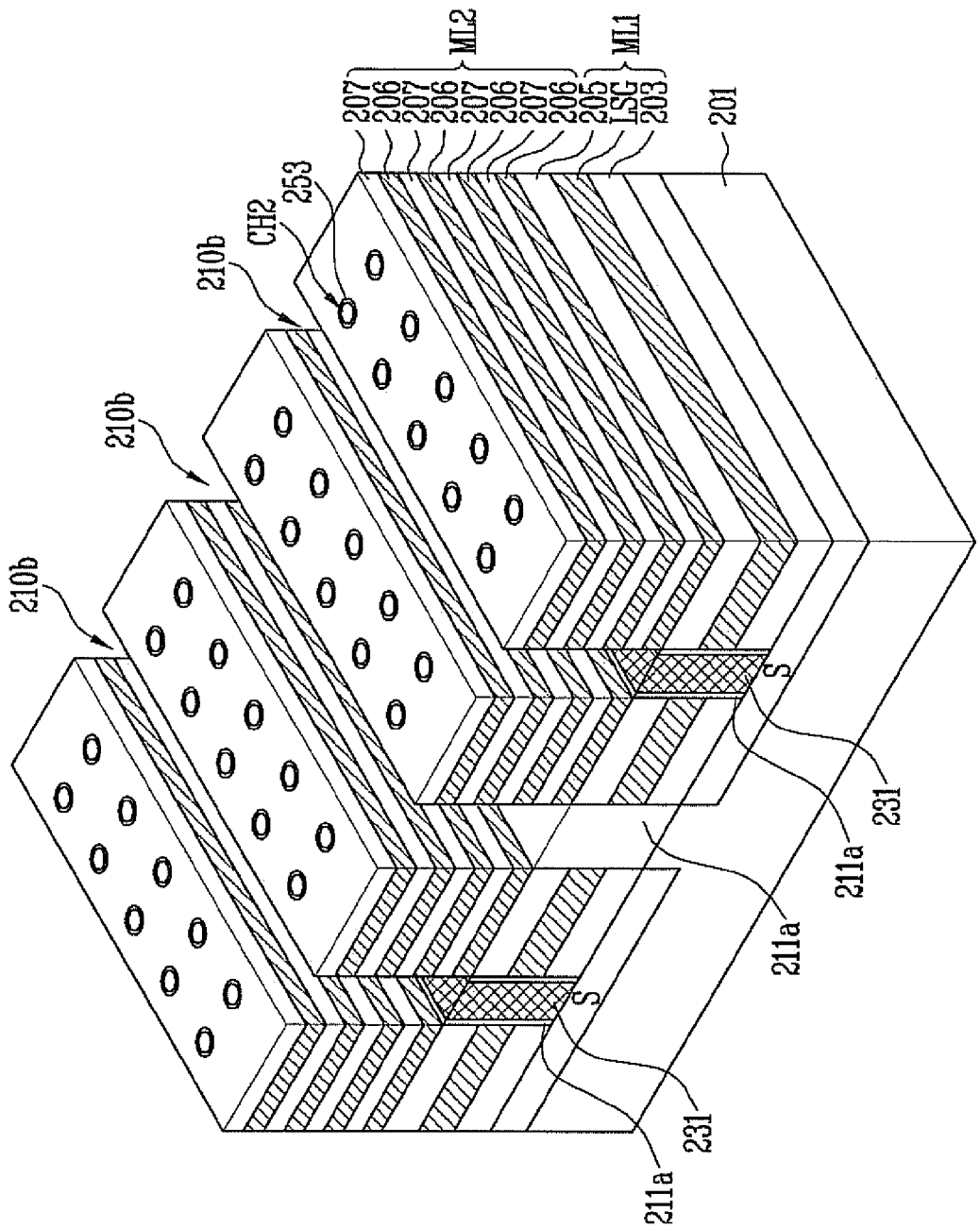

Referring to FIG. 14C, cell gate layers 206 and insulating layers 207 for a second stack structure ML2 are alternately stacked over the entire surface in which the source contact lines 231 are formed. The number of cell gate layers 206 and the number of insulating layers 207 may vary depending on the number of memory cells to be stacked. Each of the cell gate layers 206 may be a silicon layer, and each of the insulating layers 207 may be an oxide layer.

Second holes through which the first vertical channel layers CH1 are exposed, respectively, are formed by etching the second stack structure ML2. Next, a charge blocking layer, a charge trap layer 253, and a tunnel dielectric layer are sequentially formed over all the insides of the second holes. The charge blocking layer and the tunnel dielectric layer may be formed of silicon oxide layers, and the charge trap layer 253 may be formed of a silicon nitride layer including traps for binding electric charges. That is, an Oxide/Nitride/Oxide (ONO) layer is formed within the second holes. The charge blocking layer, the charge trap layer 253, and the tunnel dielectric layer are formed not only on the inner walls of the second holes, but also on top of the second stack structure ML2 and the first vertical channels CH1 exposed at the bottoms of the second holes.

Next, the charge blocking layer, the charge trap layer 253, and the tunnel dielectric layer that are formed on top of the second stack structure ML2 and at the bottoms of the second holes are removed by an etch process, such as etch-back, so that the charge blocking layer, the charge trap layer 253, and the tunnel dielectric layer remain, for example, only on the inner walls of the second holes. Next, the second holes are filled with polysilicon, so that the second vertical channel layers CH2 coupled to the first vertical channel layers CH1, respectively, are formed. Accordingly, multi-layered memory cells are formed.

In order to split the second stack structure ML2 into the plurality of memory blocks, second slits 210b are formed by etching the second stack structure ML2. The second slits 210b overlap with the first slits 210a, respectively, and the source contact line 231 and the first block insulating layer 211a are exposed through the second slit 210b.

Figure 14D:
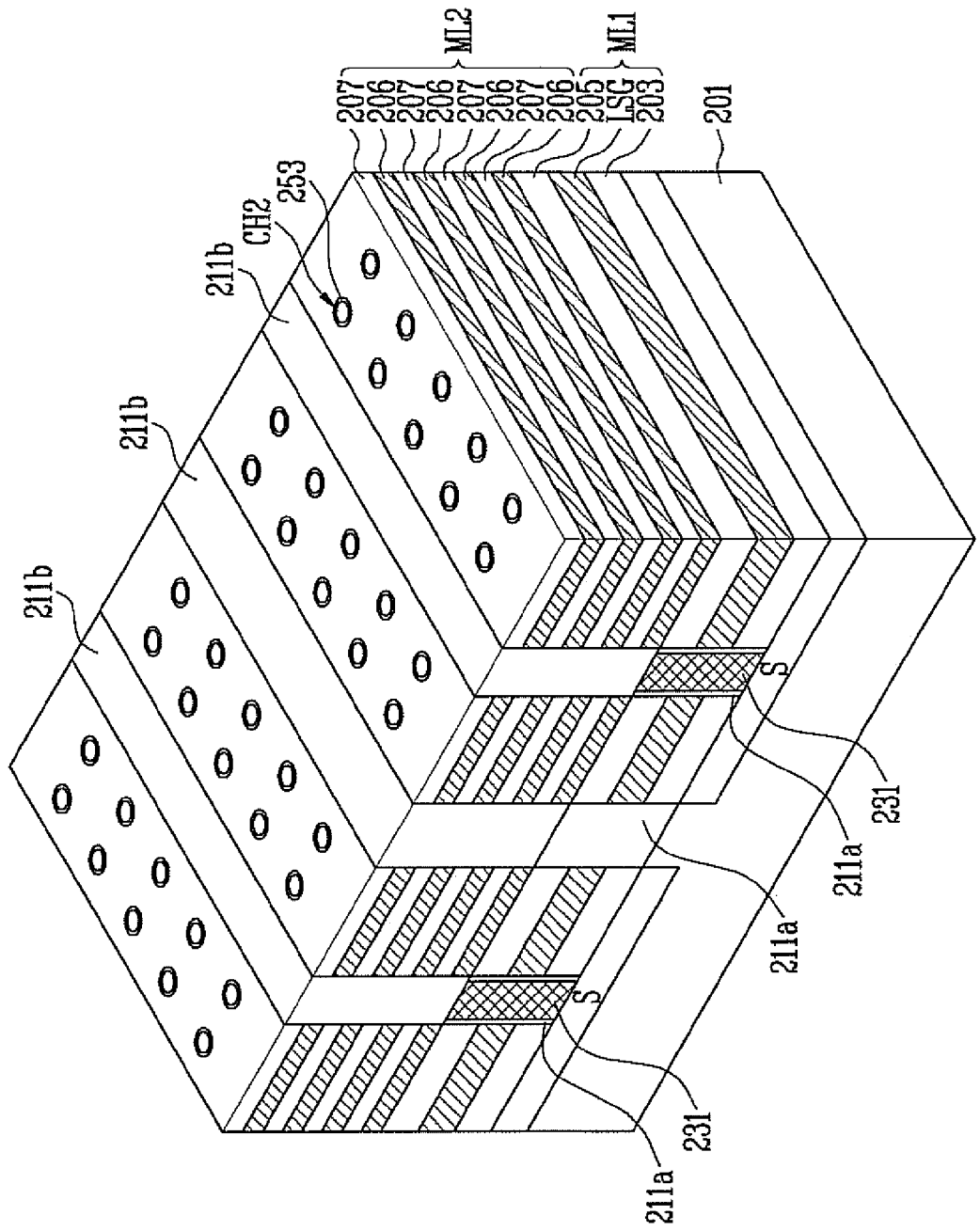

Referring to FIG. 14D, the insides of the second slits 210b are filled with a second block insulating layer 211b. The second block insulating layer 211b is deposited to fill the insides of the second slits 210b and is subsequently polished by a polishing process, such as chemical mechanical polishing (CMP). The second block insulating layer 211b may be formed of an oxide layer. A nitride layer that functions as an etch-stop layer when the second block insulating layer 211b is polished may be further formed on top of the second stack structure ML2. The second stack structures ML2 separated from each other by the second slit 210b are insulated from each other by the second block insulating layer 211b.

Figure 14E:
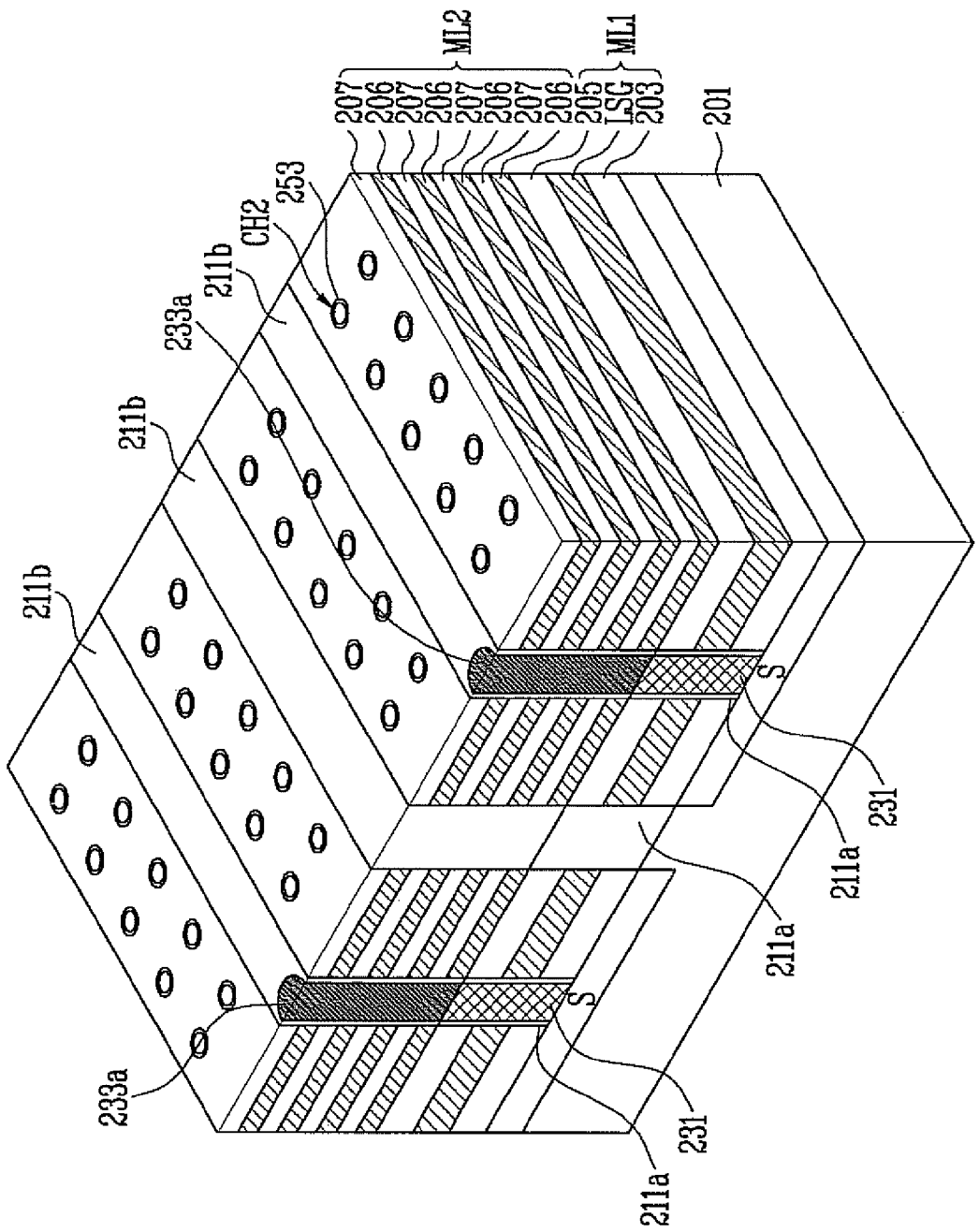

Referring to FIG. 14E, first via holes are formed within the second block insulating layer 211b by etching parts of the second block insulating layer 211b on top of the source contact line 231. The first via holes are formed to expose parts of the source contact lines 231. A conductive layer is formed on the entire surface in which the first via holes are formed so that the first via holes are filled. The conductive layer may be a polysilicon layer, a metal layer, a metal alloy layer, or a metal silicide layer. The metal layer may be made of tungsten (W) or copper (Cu) which has low resistance, and the metal silicide layer may be made of nickel silicide (NiSix) or tungsten silicide (WSix) having low resistance. Here, x is a natural number. The conductive layer is polished by chemical mechanical polishing (CMP) so that it remains, for example, only within the first via holes. Accordingly, first via contact plugs 233a coupled to the respective source contact lines 231 are formed within the first via holes.

Although not shown, step structures are formed at both ends of each of the first and the second stack structures ML1 and ML2 split by the memory block so that both ends of the lower conductive layer LSG extends more than both ends of the upper conductive layer 206. The step structures are formed by stepwise patterning the first and the second stack structures ML1 and ML2 by using a slimming process. The slimming process is performed by repeatedly performing an etch process so that the step structures are formed at both ends of the conductive layers LSG and 206 while reducing the width of a photoresist pattern at each etching process by using the photoresist pattern as an etch barrier.

Next, a process of forming upper select transistors, a process of forming bit lines, a process of forming via contact plugs (that is, a process of forming second via contact plugs), and a process of forming common source lines, such as those described with reference to FIGS. 8A to 11B, are performed. The process of forming the upper select transistors, the process of forming the bit lines, and the process of forming the common source lines according to the second embodiment of this disclosure are the same as those of the first embodiment, and a description thereof is omitted as being redundant. In the process of forming the second via contact plugs according to the second embodiment, the second via contact plugs are formed by filling second via holes through which the first via contact plugs 233a are exposed, respectively, with conductive material without filling via holes through which the respective source contact lines 231 are exposed with conductive material. The conductive material forming the second via contact plugs may be a metal layer, a metal alloy layer, or a silicide layer.

The first and the second via holes and the first and the second via contact plugs may be coupled to the source contact lines 231, respectively, or may be formed among the plurality of bit lines so that a plurality of the first and the second via holes and a plurality of the first and the second via contact plugs are coupled to each of the source contact lines 231.

Figure 15A:
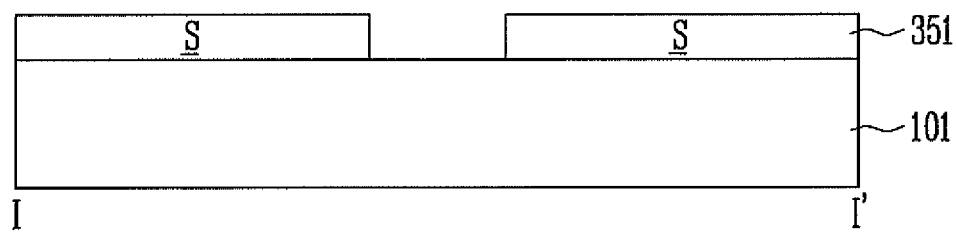
FIGS. 15A to 15C are cross-sectional views illustrating a method of manufacturing a semiconductor memory device according to a fourth embodiment of this disclosure.
Figure 15B:
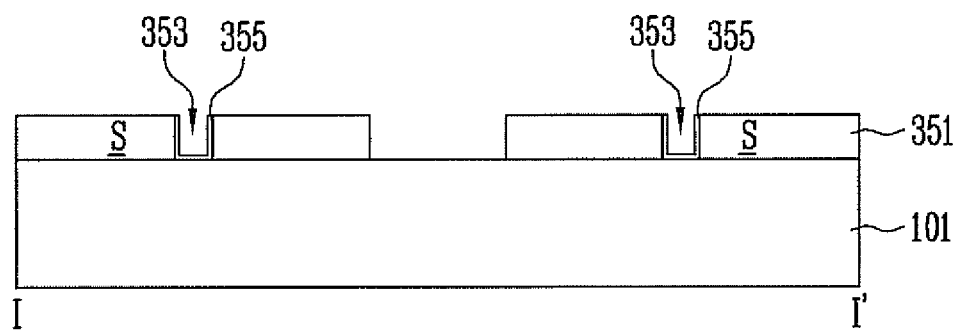
Figure 15C:
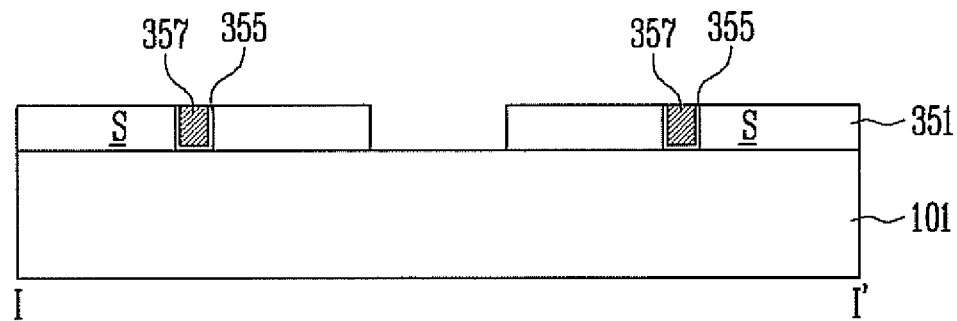

FIGS. 15A to 15C are cross-sectional views illustrating a method of manufacturing a semiconductor memory device according to a fourth embodiment of this disclosure. FIGS. 15A to 15C show an example in which source regions S are formed of doped polysilicon layers.

Referring to FIG. 15A, in the first to third embodiments of this disclosure, the source regions S may be formed by forming a doped polysilicon layer 351 on a semiconductor substrate 301 and patterning the doped polysilicon layer 351.

Referring to FIG. 15B, source trenches 353 are formed by etching regions corresponding to the bottoms of slits, from the respective source regions S. If this method is applied to the first and the second embodiments, the source trenches 353 are formed in respective regions overlapped with the bottoms of the slits. If this method is applied to the third embodiment, the source trenches 353 are formed in respective regions corresponding to the bottoms of the first slits.

An adhesive layer 355 is formed on the insides of the source trenches 353. The adhesive layer 355 may be formed on the entire surface in which the source trenches 353 are formed so that the adhesive layer 355 remain, for example, only on the insides of the source trenches 353 through an etch process using an etch mask. In some embodiments, the adhesive layer 355 may be deposited on the entire surface, and the adhesive layer 355 formed on top of the source regions S may be subsequently removed by a polishing process so that the adhesive layer 355 remains, for example, only on the insides of the source trenches 353. The adhesive layer 355 may be formed of at least one of a Ti layer and a TiN layer.

Referring to FIG. 15C, lower source contact lines 357 are formed within the respective source trenches 353.

The lower source contact lines 357 may be formed using the same material as source contact lines to be subsequently formed. Next, the same processes of forming stack structures as those described with reference to FIGS. 6A to 14A are performed.

Figure 16:
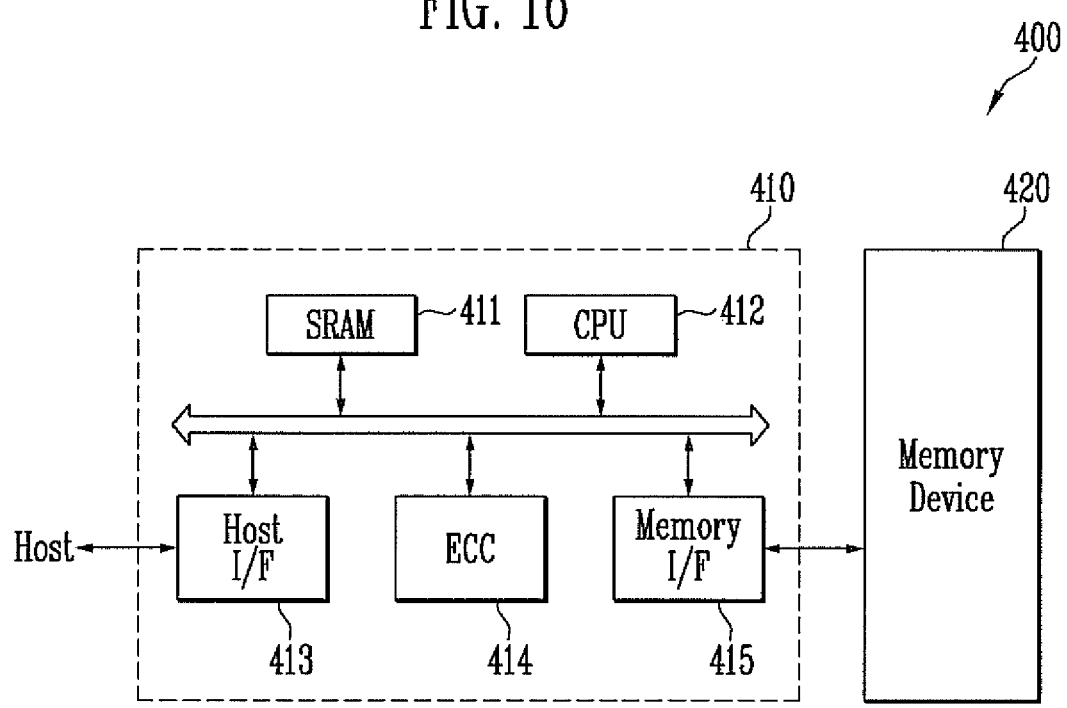
FIG. 16 is a schematic block diagram of a memory system according to an embodiment of this disclosure.

FIG. 16 is a schematic block diagram of a memory system according to an embodiment of this disclosure.

Referring to FIG. 16, the memory system 400 of this disclosure includes a memory device 420 and a memory controller 410.

The memory device 420 includes at least one of the semiconductor memory devices described with reference to FIGS. 5A to 15C. More specifically, the memory device 420 includes a plurality of memory blocks formed over a substrate including source regions and split by slits, a plurality of bit lines coupled to the strings of the memory blocks and disposed over the memory blocks, and source contact lines formed within the slits, coupled to the respective source regions, and formed to cross the plurality of bit lines. Lower source contact lines may be further formed in the source regions under the source contact lines, and an adhesive layer may be further formed between the lower source contact line and the source region.

The memory controller 410 controls the exchange of data between a host Host and the memory device 420. The memory controller 410 may include a Central Processing Unit (CPU) 412 for controlling an overall operation of the memory system 400. The memory controller 410 may include SRAM 411 that is used as the operating memory of the CPU 412. The memory controller 410 may further include a host interface (I/F) 413 and a memory I/F 415. The host I/F 413 may be equipped with a data exchange protocol between the memory system 400 and the host Host. The memory I/F 415 may couple the memory controller 410 and the memory device 420. The memory controller 410 may further include an ECC block 414. The ECC block 414 may detect and correct error in data read out from the memory device 420. Although not shown, the memory system 400 may further include a ROM device for storing code data for an interface with the host Host. The memory system 400 may be used as a portable data storage card. In some embodiments, the memory system 400 may be implemented using a Solid State Disk (SSD) capable of replacing the hard disk of a computer system.

According to exemplary embodiments, the source contact lines coupled to the source regions are formed within the slits that split the memory blocks including the memory cells arranged to have a 3-D structure. Thus, resistance of the source contact lines may be improved because the source contact line can have a wider area than a source contact plug formed within a contact hole. Consequently, a source line bouncing phenomenon may be reduced because the source contact line has low resistance.

What is claimed is:

1. A semiconductor memory device, comprising:
    channel layers vertically protruded from a substrate including a source region;
    stack structures stacked over the substrate and surrounding the channel layers;
    a slit penetrating the stack structures so that the stack structures are divided into memory blocks;
    bit lines coupled to the channel layers; and
    a source contact line formed within the slit, coupled to the source regions, and disposed in a direction to cross the bit lines.

2. The semiconductor memory device of claim 1, wherein the source contact line is in the form of a sheet vertically extending from the substrate.

3. The semiconductor memory device of claim 1, wherein the stack structures comprises:
    a first stack structure including a lower select gate layer formed over the source region; and
    a second stack structure including cell gate layers stacked over the lower select gate layer.

4. The semiconductor memory device of claim 3, wherein the source contact line extends vertically from the source region to the second stack structure.

5. The semiconductor memory device of claim 4, further comprising:
    an upper select gate layer formed between the second stack structure and the bit lines and surrounding the channel layer;
    an interlayer dielectric layer formed to cover the source contact line and the bit lines;
    a via contact plug formed to penetrate the interlayer dielectric layer and coupled to the source contact line; and
    a common source line formed on the interlayer dielectric layer to extend in the same direction that the source contact line extends and coupled to the via contact plug.

6. The semiconductor memory device of claim 5, wherein the via contact plug is placed between the bit lines adjacent to each other.

7. The semiconductor memory device of claim 4, further comprising a block insulating layer formed between an inner wall of the slit and the source contact line.

8. The semiconductor memory device of claim 3, wherein the source contact line extends vertically from the source region to the first stack structure.

9. The semiconductor memory device of claim 8, further comprising a first block insulating layer formed between an inner wall of the slit and the source contact line.

10. The semiconductor memory device of claim 9, further comprising:
    a second block insulating layer formed over the first block insulating layer and the source contact line and formed to fill the slit;
    a first via contact plug formed to penetrate the second block insulating layers and coupled to the source contact line;
    an upper select gate layer formed between the second stack structure and the bit lines and surrounding the channel layer;
    an interlayer dielectric layer formed to cover the first via contact plug and the bit lines;
    a second via contact plug formed to penetrate the interlayer dielectric layer and coupled to the first via contact plug; and
    a common source line formed on the interlayer dielectric layer to extend in the same direction that the source contact line extends and coupled to the second via contact plug.

11. The semiconductor memory device of claim 10, wherein the first and the second via contact plug are disposed between the bit lines adjacent to each other.

12. The semiconductor memory device of claim 1, wherein the source regions is a doped polysilicon layer formed on the substrate.

13. The semiconductor memory device of claim 12, further comprising:
    a source trench formed to penetrate the doped polysilicon layer under the slit;
    an adhesive layer formed on a surface of the source trench; and a lower source contact line formed on the adhesive layer and formed to fill the source trench.

* * * * *